US009489297B2

(12) United States Patent
Peterson et al.

(10) Patent No.: US 9,489,297 B2
(45) Date of Patent: Nov. 8, 2016

(54) PREGROOMER FOR STORAGE ARRAY

(71) Applicant: Fusion-io, Inc., Salt Lake, UT (US)

(72) Inventors: James Peterson, San Jose, CA (US); Ned Plasson, Salt Lake City, UT (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 639 days.

(21) Appl. No.: 13/746,225

(22) Filed: Jan. 21, 2013

(65) Prior Publication Data

US 2014/0207997 A1 Jul. 24, 2014

(51) Int. Cl.
*G06F 12/12* (2016.01)
*G06F 12/02* (2006.01)
*G11C 8/06* (2006.01)

(52) U.S. Cl.
CPC ... *G06F 12/0246* (2013.01); *G06F 2212/7204* (2013.01); *G06F 2212/7205* (2013.01); *G06F 2212/7207* (2013.01); *G11C 8/06* (2013.01)

(58) Field of Classification Search
CPC   G06F 12/0246; G06F 3/0647; G11C 16/102
USPC .......................................................... 711/103
See application file for complete search history.

(56) References Cited

U.S. PATENT DOCUMENTS

| 7,328,307 | B2 | 2/2008 | Hoogterp |
| 7,836,226 | B2 | 11/2010 | Flynn et al. |
| 8,074,011 | B2 | 12/2011 | Flynn et al. |
| 8,195,912 | B2 | 6/2012 | Flynn et al. |
| 8,195,978 | B2 | 6/2012 | Flynn et al. |
| 8,364,883 | B2 * | 1/2013 | Bennett ............... G06F 12/0246 711/100 |
| 2001/0037336 | A1 * | 11/2001 | Sauntry ................. G06F 12/023 |

\* cited by examiner

*Primary Examiner* — Jae Yu
(74) *Attorney, Agent, or Firm* — Kunzler Law Group, PC

(57) ABSTRACT

Techniques are disclosed relating to arranging data on storage media. In one embodiment, a computer system is configured to access a storage array that includes a plurality of storage blocks. The computer system executes a first set of processes and a second set of processes, where the first set of processes operates on selected ones of the plurality of storage blocks to increase a likelihood that the selected storage blocks are operated on by the second set of processes. In some embodiments, the second set of processes determines whether to operate on a storage block based on an amount of invalid data within the storage block. In such an embodiment, the first set of processes increases a likelihood that the storage block is operated on by increasing the amount of invalid data within the storage block.

24 Claims, 19 Drawing Sheets

PREGROOMER FOR STORAGE ARRAY

BACKGROUND

1. Technical Field

This disclosure relates generally to data storage, and, more specifically, to arranging data stored on storage media.

2. Description of the Related Art

A set of data is typically written to solid-state storage media by performing an erase operation on a group of memory cells followed by a program operation on those cells. Because of the small size of these cells and the high voltages used to perform these operations, the cells can only be erased and programmed a limited number of times before the transistors within the cells begin to degrade.

To improve the longevity of memory cells, modern storage systems may implement a log-structured storage to ensure that writes to cells are more evenly distributed across the storage to produce better wear leveling (as opposed to writing particular cells frequently while other cells go unused). When storing data using a log-structure storage, data may be written at an append point that starts at an initial portion in the storage and advances forward as writes are performed. Accordingly, when portions of data are updated, rather than overwriting those portions with the updated data, the previously stored portions of the data may instead be invalidated as updated versions of the data are written to the append point in the storage. The memory cells storing the invalid data may eventually be erased in order to permit the cells to be programmed to store subsequent data.

In some instances, a storage system may execute a groomer process that is responsible for identifying blocks of memory cells with invalid data and erasing those blocks. This identifying and erasing of blocks for subsequent reuse is sometimes referred to as "garbage collection."

SUMMARY

The present disclosure describes embodiments in which a set of one or more processes invalidates data within storage blocks in a storage array. For example, the set of processes may select storage blocks in a storage array based on various criteria and operate on the storage blocks to increase a likelihood that the storage blocks are reclaimed. In some instances, a storage array may be organized as a log structure such that, when data is written to the storage array, it is stored at an append point within the array; any previous instances of the data within the storage array are invalidated. In one embodiment, execution of the set of processes increases the likelihood that a storage block will be reclaimed by invalidating valid data from a selected storage block.

In some embodiments, the set of processes may be referred to as a "pregroomer," which may operate in conjunction with another set of one or more processes called a "groomer." The groomer is responsible for reclaiming storage blocks and may identify a storage block as a candidate for garbage collection based on the amount of invalid data present in the storage block. Once identified, the groomer may perform a preparation operation on that block (e.g., an erase operation). In some instances, execution of a pregroomer can improve performance of the groomer. A pregroomer may also facilitate goals other than improved garbage collection. For example, some embodiments of the pregroomer may move data within the storage array based on criteria for consolidating metadata in the storage array and improving wear leveling of memory cells.

In one disclosed embodiment, a method is performed on a system configured to access a plurality of storage blocks. The method includes executing a first of processes on the system and executing a second set of processes on the system. The first set of processes operates on selected ones of the plurality of storage blocks to increase a likelihood that the selected storage blocks are operated on by the second set of processes.

In some embodiments, the second set of processes determines whether to operate on a storage block based on an amount of invalid data within the storage block and/or other factors. In one embodiment, the first set of processes increases a likelihood that the storage block is operated on by increasing the amount of invalid data within the storage block. In one embodiment, the second set of processes operates on ones of the selected storage blocks by erasing the erase blocks. The first set of processes increases the amount of invalid data within the storage block by copying valid data from the storage block to another one of the plurality of storage blocks and marking the valid data within the storage block as invalid data. In one embodiment, the first set of processes selects two or more of the plurality of storage blocks having a set of data that is stored in a non-contiguous portion of a physical address space. The first set of processes increases the likelihood that the second set of processes operates on the two or more storage blocks by consolidating the set of data to a contiguous portion of the physical address space. In some embodiments, the set of data corresponds to a contiguous portion of a logical address space. In such an embodiment, consolidating the set of data reduces a number of nodes in a forward mapping data structure usable to map an address from the logical address space to an address in the physical address space. In some embodiments, the first set of processes selects the two or more storage blocks based on a rate of change of the set of data. In some embodiments, the first set of processes selects the two or more storage block in response to the two or more storage blocks including metadata. In some embodiments, the system maintains a current version of a set of metadata in volatile memory and maintains a non-current version of the set of metadata in one or more of the plurality of storage blocks. The first set of processes increases a likelihood that the second set of processes operates on the one or more storage blocks by writing the current version of the set of metadata to another one of the plurality of storage blocks.

In another disclosed embodiment, a non-transitory computer readable medium has program instructions stored thereon. The program instructions are executable by a computer system to cause the computer system to select a first of a plurality of erase blocks in a storage array accessible to the computer system, and to invalidate a subset of valid data within the first erase block.

In still another disclosed embodiment, an apparatus is configured to manage a plurality of erase blocks in a storage array. The apparatus includes a selection module configured to select a first of the plurality of erase blocks. The apparatus also includes a copy module configured to copy a subset of valid data within the first erase block to a second of the plurality of erase blocks.

Figure 1:
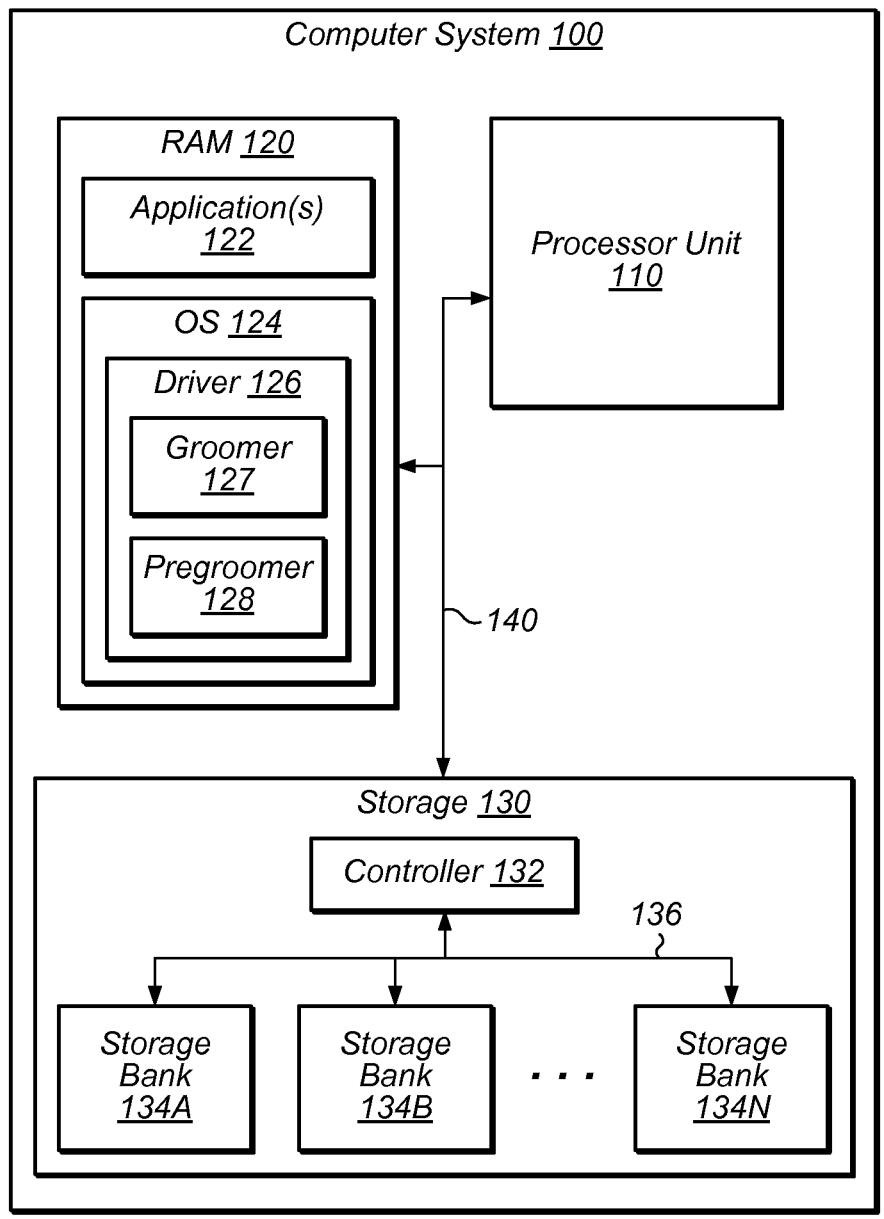
FIG. 1 is a block diagram illustrating one embodiment of a computer system including a solid-state storage array.

The disclosure includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

This disclosure also includes and references the accompanying drawings. In the drawings, similar symbols typically identify similar components, unless context dictates otherwise. The illustrative embodiments described in the detailed description, drawings, and claims are not meant to be limiting. Other embodiments may be utilized, and other changes may be made to these exemplary embodiments, without departing from the scope of the disclosure.

DETAILED DESCRIPTION

Figure 2:
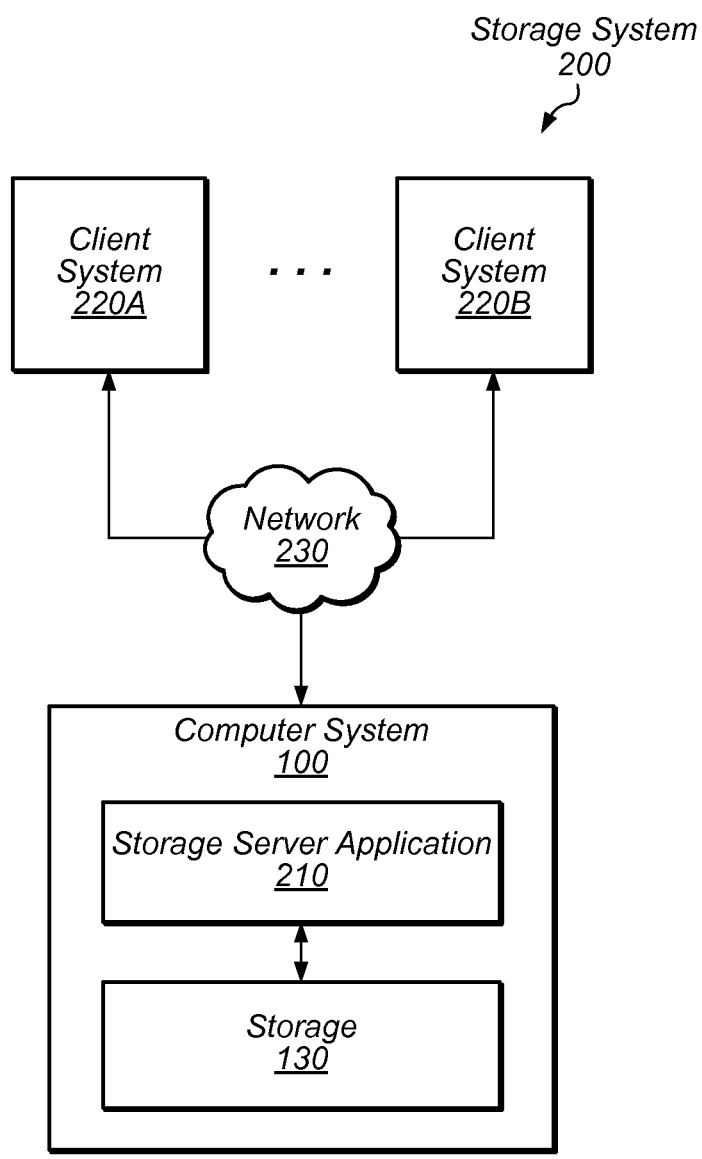
FIG. 2 is a block diagram illustrating one embodiment of a storage system that includes a solid-state storage array.

The disclosure initially describes, with reference to FIGS. 1 and 2, a computer system that executes a pregroomer process in conjunction with a solid-state storage array. To facilitate this description, logical and physical address spaces used to facilitate the implementation of a log-structure storage array are described with reference to FIGS. 3A-3C. A driver for the solid-state storage array is described with reference to FIGS. 4-6. Examples of the pregroomer process are then described in further detail with reference to FIGS. 7-12.

Turning now to FIG. 1, a block diagram of computer system 100 is depicted. Computer system 100 may be any suitable type of computer system such as a server, laptop, desktop, a mobile device, etc. In the illustrated embodiment, computer system 100 includes a processor unit 110, random access memory (RAM) 120, and storage 130 coupled together via an interconnect 140. As shown, RAM 120 may include program instructions for one or more applications 122 and an operating system (OS) 124 executable by processor unit 110. In the illustrated embodiment, OS 124 includes a driver 126, which further includes groomer 127 and pregroomer 128.

In various embodiments, the functionality of groomer 127 and/or pregroomer 128 may be implemented in software, hardware or a combination thereof. Further, groomer 127 and pregroomer 128 need not be located within OS 124. For example, in one embodiment, such functionality may be implemented by software outside of OS 124—e.g., as an application 122. In another embodiment, this functionality may be implemented by software stored within a memory of controller 132 and executed by a processor of controller 132. In still another embodiment, controller 132 may include dedicated circuitry to implement functionality of groomer 127 and/or pregroomer 128. In sum, the depiction of groomer 127 and pregroomer 128 as being implemented in software within OS 124 should not be seen as limiting, but rather as a depiction of an exemplary embodiment.

Storage 130 is representative of any physical medium upon which data can be recorded. As used herein, the term "recorded" refers broadly to the process of an electronic computing device storing, writing or otherwise transferring one or more data values on to some physical medium for subsequent use. Accordingly, a "physical recording medium" is used herein to refer to any medium on which data may be recorded by an electronic computing device. Further, the terms "storage" and "memory" are used herein to be synonymous with "physical recording medium." Given this broad definition, the designation storage 130 in FIG. 1 and elsewhere in this disclosure may refer to volatile and/or non-volatile media. Such media may also be referred to herein as "memory," and portions of such media may be referred to as "blocks," "cells," "storage blocks," "memory blocks," etc. Collectively, a group of these blocks may be referred to as a "storage array," "memory array," etc.

In some embodiments, storage 130 may be implemented such that it includes non-volatile memory. Accordingly, in such an embodiment, storage banks 130 may include non-volatile storage devices such as hard disk drives (e.g., Integrated Drive Electronics (IDE) drives, Small Computer System Interface (SCSI) drives, Serial Attached SCSI (SAS) drives, Serial AT Attachment (SATA) drives, etc.), tape drives, writable optical drives (e.g., CD drives, DVD drives, Blu-Ray drives, etc.) etc.

In some embodiments, storage 130 may be implemented such that it includes non-volatile solid-state memory. Accordingly, in such an embodiment, storage banks 130 may include any suitable type of solid-state storage media including, but not limited to, NAND flash memory, NOR flash memory, nano RAM ("NRAM"), magneto-resistive RAM ("MRAM"), phase change RAM ("PRAM"), Racetrack memory, Memristor memory, nanocrystal wire-based memory, silicon-oxide based sub-10 nanometer process memory, graphene memory, Silicon-Oxide-Nitride-Oxide-Silicon ("SONOS"), Resistive random-access memory ("RRAM"), programmable metallization cell ("PMC"), conductive-bridging RAM ("CBRAM"), etc. In some embodiments, storage banks 130 may include multiple, different types of solid-state storage media.

In other embodiments, storage 130 may be implemented such that it includes volatile memory. Storage banks 134 may thus correspond to any suitable volatile memory including, but not limited to such as RAM, dynamic RAM (DRAM), static RAM (SRAM), synchronous dynamic RAM (SDRAM), etc. Although shown independently of processor unit 110, in some embodiments, storage 130 may correspond to memory within processor unit 110 such as one or more cache levels (e.g., L1, L2, L3, etc.) within processor unit 110.

In sum, various functionality will be described herein pertaining to storage 130. Such functionality may be applicable to any suitable form of memory including both non-volatile and volatile forms. Thus, while particular embodiments of groomer 127 are described herein within the context of non-volatile solid-state memory arrays, groomer 127 may also be applicable to other recording media such as volatile memories and other types of non-volatile memories, particularly those that include a reclamation process.

References in this disclosure to "accessing" data in storage 130 refers to any type of transaction, including writing data to storage 130 and/or reading data from storage 130, as well as, TRIM operations, maintenance accesses, discovery accesses, load and store operations under memory semantics, and the like. Further, given the broad definitions of "storage" and "memory" referred to above, these accesses may be applicable to a storage device that has non-volatile memory and/or volatile components.

In the illustrated embodiment, storage 130 includes a controller 132 coupled to banks 134 via an interconnect 136. Controller 132, in one embodiment, is a controller configured to manage operation of storage 130. Accordingly, controller 132 may facilitate performance of read operations at specified addresses (e.g., "physical addresses" as discussed below) including selecting the appropriate banks 134 and accessing the data within the appropriate cells within those banks. Controller 132 may also facilitate performance of write operations including programming of particular cells as well as erasing blocks of cells for subsequent reuse. (The cycle of programming and erasing a block of cells may be referred to as a "PE cycle.") In some embodiments, controller 132 implements separate read and write data pipelines to perform read and write operations in parallel. In one embodiment, controller 132 is also configured to communicate with driver 126 (discussed below) over interconnect 140. For example, in some embodiments, controller 132 communicates information for read and write operations via direct memory access (DMA) transactions coordinated by a DMA controller. Accordingly, controller 132 may support any suitable interconnect type such as a peripheral component interconnect (PCI), PCI express (PCI-e), serial advanced technology attachment ("serial ATA" or "SATA"), parallel ATA ("PATA"), small computer system interface ("SCSI"), IEEE 1394 ("FireWire"), Fiber Channel, universal serial bus ("USB"), etc. In some embodiments, controller 132 may also perform other operations such as error checking, data compression, encryption and decryption, packet assembly and disassembly, etc.

In various embodiments, storage 130 is organized as a log-structured storage. As used herein, the term "log structure" refers to the storing of data at an append point that is advanced sequentially through an "address space" as data is stored. The use of a log structure also connotes that metadata is stored in conjunction with the data in order to permit the storage 130 to be restored to a previous state (i.e., a "log checkpoint"). Such a restoration may be performed, for example, to facilitate crash recovery in the event of power loss, to recover a last known valid state in the event of data corruption, etc. As used herein, the term "address space" refers to a range of addresses that can be used to specify data within the storage array. As will be described below, a log-structured storage array may have both logical and physical address spaces. As noted above, using a log structure can improve the longevity of memory cells by ensuring that write operations are more evenly distributed, thus improving wear leveling of the storage array. One embodiment of a log-structure is discussed in conjunction with FIG. 3C.

In one embodiment, applications 122 may operate on data that is written to and/or read from storage 130. In some instances, an application 122 may access data within storage 130 by specifying a corresponding file name to OS 124 via an application programming interface (API) request (in other instances, an application may access data directly by specifying an address to be read from or written to). OS 124, in turn, may implement a file system. In some embodiments, this may include maintaining file system information (e.g., a set of modes, file allocation tables, etc.) corresponding to directories and files within the file system. In response to the receiving the request, OS 124 may access the file system information to determine one or more addresses where data for the file is stored. OS 124 may then convey these addresses to driver 126.

Driver 126, in one embodiment, is executable to permit applications 122 and OS 124 to interact with storage 130. Accordingly, driver 126 may receive requests to perform read and write operations at specified addresses and may issue corresponding commands to controller 132 to implement those operations. To perform these operations, in some embodiments, driver 126 maps logical addresses corresponding to a logical address space to physical addresses corresponding to a physical address space (in other embodiments, mapping logical addresses to physical addresses may be performed at any suitable location, such as at controller 132). As noted above, using a log structure may permit multiple instances of a set of data to be present in storage 130 as the data is written and rewritten to storage 130. In some embodiments, OS 124 may track these instances so that an application 122 receives the current instance of the data (rather than receiving an older invalid instance stored in storage). In other embodiments, to simplify the file system, driver 126 tracks physical addresses of the instances so that OS 124 can specify the same address (i.e., the same logical block address (LBA)) over time and receive the current instance of data corresponding that address. Accordingly, as used herein, the term "logical address space" refers to an address space as perceived by higher-level processes (i.e., process that are above the level at which mapping is performed—such as at the driver level, in one embodiment) such as OS 124 and applications 122, even though this address space may not be representative of how data is actually organized on the physical media of storage 130. In contrast, the term "physical address space" refers to the address space used by lower-level processes (such as driver 126 and/or other logic executing on controller 132, in one embodiment) and is indicative of how data is organized on the physical media of storage 130. Embodiments of logical and physical address spaces are discussed in further detail in conjunction with FIGS. 3A and 3B, respectively.

In some embodiments, as part of tracking data in a physical address space, driver 126 labels older instances of data in storage 130 (i.e., those instances that are not the current instance) as invalid. For example, in one embodiment, when a value is to be updated, driver 126 may issue a command to controller 132 to write the value at a storage block specified by the current append point (which may be maintained by driver 126, controller 132, etc.). In response to receiving an indication that the write has been successfully performed, driver 126 may record, for each previously stored instance of that value, an indication that that instance is invalid. As used herein, the term "invalid" refers to data that no longer needs to be stored by storage 130 and should not be used or provided to a user application 122. Similarly, the term "invalidating" refers to the marking of data as invalid (e.g., storing a record in a data structure).

In some embodiments, driver 126 also labels a current instance of data as invalid in response to receiving a TRIM command. As used herein, a "TRIM command" refers to an indication (which may be issued by an operating system, file system, or other application 122) specifying that a storage array no longer needs to store a particular set of data, and thus can mark the data as invalid. A TRIM command may be issued, for example, in response to the deletion of a file, directory, etc.—for example, by a user. In one embodiment, in response to receiving a TRIM command, driver 126 further writes a note (i.e., a "TRIM note") indicative of the received TRIM command and the invalidated data to storage 130. In some embodiments, the TRIM note is added as metadata to the log structure at an append point of the structure. This may permit, in some situations, the recovery of the state of valid data.

In some embodiments, driver 126 also manages garbage collection for storage 130 to reclaim storage blocks with invalid data. (In other embodiments, garbage collection may be performed by processes other than those associated with driver 126; for example, in one embodiment, controller 132 executes instructions stored in a memory of controller 132 to perform garbage collection.) In the illustrated embodiment, driver 126 performs garbage collection via groomer 127 and pregroomer 128. (As noted above, in other embodiments, operations described herein as being performed by groomer 127 and/or pregroomer 128 may be performed by software located elsewhere in system 100, as well as in firmware and/or hardware.)

Groomer 127, in one embodiment, is a set of processes executable to identify and reclaim storage blocks so that they can be subsequently programmed to store data. (As used herein, the phrase "set of processes" refers to a group of one or more processes; accordingly, groomer 127 (as well pregroomer 128) may comprise single or multiple processes. As used herein, the term "process" refers generally to programs, threads, interrupt service routines, or other executable instances of program instructions.) As will be described in further detail below in conjunction with FIGS. 4 and 6, in various embodiments, groomer 127 may be invoked when the amount of available space in storage 130 (i.e., the number of storage blocks that are able to currently be programmed) falls below a threshold. Groomer 127 may then identify candidate storage blocks to be reclaimed (e.g., erased in the case of flash media) based on the amount of invalid data in those blocks (e.g., groomer 127 may identify blocks with the most invalid data). Once groomer 127 has determined to reclaim a candidate block, groomer 127 copies any remaining valid data out of the block and writes remaining valid data forward in the log structure (i.e., to the append point). Groomer 127 may then initiate reclaiming the block by conveying the appropriate commands to controller 132.

Pregroomer 128, in one embodiment, is another set of processes that are executable to operate on selected storage blocks to adjust attributes of the selected storage blocks such that the selected storage blocks satisfy selection criteria for selection by groomer 127. Stated another way, a given instance of groomer 127 uses a set of criteria to select storage blocks for grooming. This set of criteria may be based on any number of different factors. As noted above, for example, one selection criteria used by groomer 127 may, in one embodiment, may be selecting a storage block having the most invalid data. Embodiments of pregroomer 128 may operate on storage blocks to give these blocks attributes that are used as selection criteria by groomer 127. Accordingly, if an embodiment includes a groomer 127 with a selection criteria based on determining a storage block with a greatest amount of invalid data, a corresponding pregroomer 128 may operate on selected storage blocks to increase an amount of invalid data in those blocks. In embodiments in which groomer 127 has a plurality of different criteria for selection of blocks, pregroomer 128 may operate on selected storage blocks to provide/enhance those blocks' attributes corresponding to one or more of these different criteria.

Pregroomer 128 may thus be described as increasing a "likelihood" that storage blocks on which it operates are selected by groomer 127. As one example, consider a groomer 127 that selects blocks for grooming based on an amount of invalid data in a block. A corresponding pregroomer 128 may, in one embodiment, operate on selected blocks by increasing the amount of invalid data in each of those blocks. For each of these blocks, then, pregroomer 128 has increased the chance that such block will be selected for processing by groomer 127. It is noted that, in adjusting attributes of storages blocks, pregroomer 128 does not necessarily guarantee that storage blocks will be operated on by groomer 127 at a given point in time. Instead, the phrase, "increasing a likelihood" connotes that pregroomer 128 has operated on selected storage blocks in an attempt to change characteristics, attributes, etc. of these blocks in a manner consistent with criteria employed by groomer 127 to selected storage blocks for grooming. In some instances, however, pregroomer 128 "increasing the likelihood" of a block's being selected by groomer 127 may include adjusting block attributes in a manner that does guarantee that one or more blocks will be selected by the groomer 127 for reclamation.

As will be described in further detail below in conjunction with FIG. 6, in one embodiment, pregroomer 128 may select these blocks based on various criteria and increase the likelihood that groomer 127 operates on these blocks by invalidating data within those blocks. In some instances, pregroomer 128 may merely mark data as invalid in selected blocks (i.e., without moving data) to increase their likelihoods of being operated on. In other instances, pregroomer 128 may copy selected valid data from those blocks and correspondingly mark the data in those blocks as invalid. Still further, in various embodiments, the copied valid data may be only a subset of the valid data present in a block (accordingly, as used herein, the term "subset of valid data" refers to some but not all of the valid data within block). In some instances, pregroomer 128 may also copy valid data from multiple selected storage blocks into a single storage block. For example, in some embodiments, pregroomer 128 may consolidate data having similar characteristics (e.g., similar properties, similar types of data, etc.) from multiple storage blocks into a single block or contiguous blocks.

In various embodiments, processes of groomer 127 and pregroomer 128 are separately executable. In some embodiments, processes of groomer 127 are more invasive than those of pregroomer 128. Accordingly, in one embodiment, groomer 127 may be invoked when the number of available storages blocks falls below a first threshold and may continue to execute until the number of available blocks rises above that threshold. Still further, in one embodiment, processes of groomer 127 may be able to suspend application-initiated I/O operations with storage 130 if the number of available storage blocks falls below a second threshold. In one embodiment, groomer 127 may be invoked in idle times or low-usage periods for storage 130. In some embodiments, pregroomer 128 may be invoked more frequently than groomer 127. For example, in one embodiment, invocations of pregroomer 128 may occur periodically while invocations of groomer 127 may be primarily I/O driven. However, in some embodiments, pregroomer 128 may be given a shorter execution time slice (i.e., the interval in which a process is allowed to execute) than groomer 127. Thus, the system resource requirements of pregroomer 128 may, in some embodiments, be tuned to a fraction of the requirements for groomer 127.

Pregroomer 128 is described in further detail below in conjunction with FIGS. 4 and 7-12.

Turning now to FIG. 2, a block diagram of a storage system 200 including computer system 100 is depicted. As discussed above, computer system 100 may include one or more applications that operate on data stored in storage 130. In the illustrated embodiment, computer system 100 executes a storage server application 210 to enable client systems 220A and 220B to access and store data in solid-state storage 130 via network 230. For example, in one embodiment, storage system 200 may be associated within an enterprise environment in which server application 210 distributes enterprise data from storage 130 to clients 220. In some embodiments, clients 220 may execute other server applications such as web servers, mail servers, virtual private network (VPN) servers, etc. to further distribute data to other computer systems. Accordingly, in some embodiments, storage server application 210 may implement various network attached storage (NAS) protocols such as the file transfer protocol (FTP), network file system (NFS) protocol, server message block (SMB) protocol, Apple file protocol (AFP), etc. In some embodiments, computer system 100 may be one of several computer systems 100 configured to implement a storage area network (SAN).

Figure 3A:
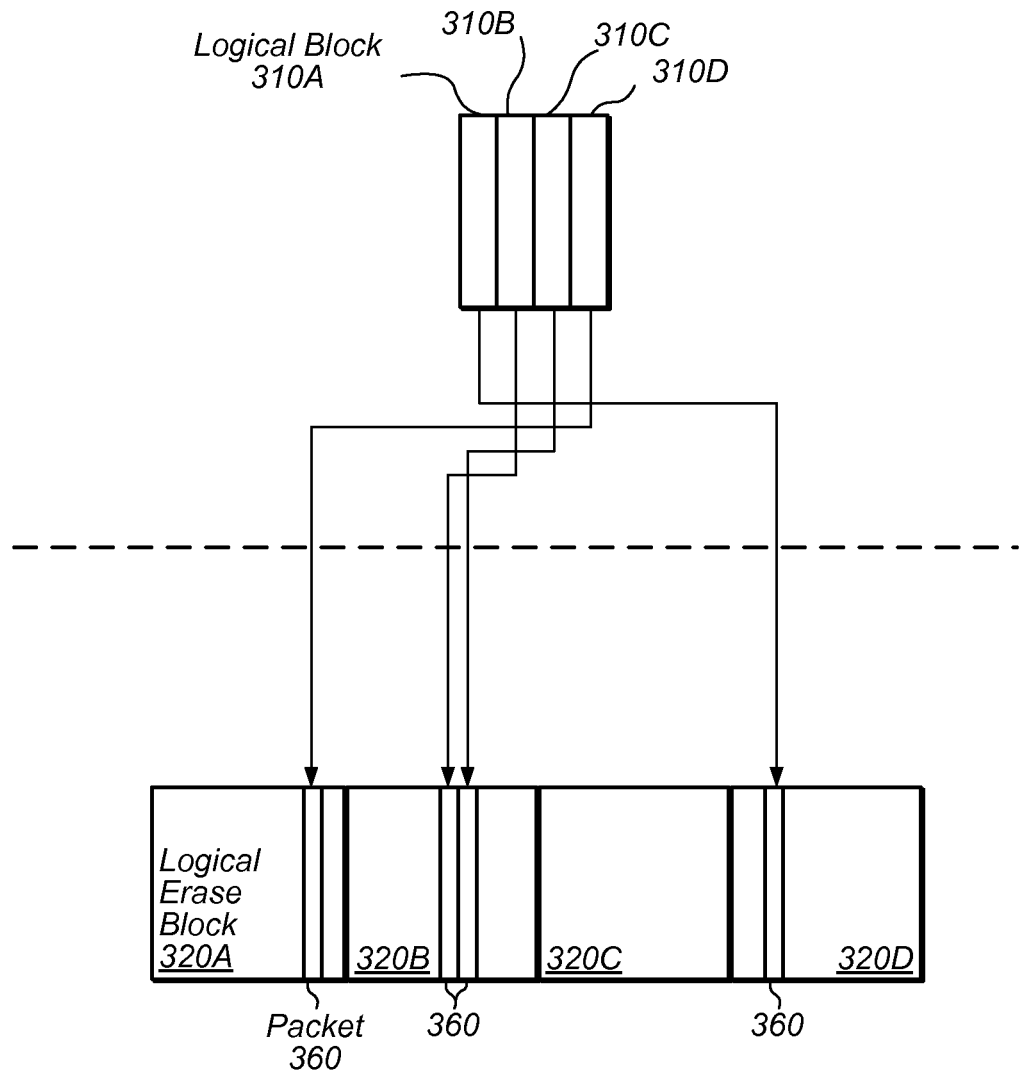
FIGS. 3A-3C are block diagrams illustrating embodiments of logical and physical address spaces.

Turning now to FIG. 3A, an exemplary mapping of a logical address space 302 to a physical address space 304 is depicted. In one embodiment, logical address space 302 represents the organization of data as perceived by higher-level processes such as applications 122 and OS 124. In one embodiment, physical address space 304 represents the organization of data on the physical media.

Logical address space 302, in one embodiment, is divided into logical addresses corresponding to respective logical blocks 310A-310D (also referred to as sectors 310). In some embodiments, the logical addresses are logical block addresses (LBAs) (in other embodiments, the logical addresses may correspond to some other form of logical identifiers). In one embodiment, sectors/blocks 310 represent the smallest block of data associated with a given logical address. As but one example, a block 310 may be approximately 512 bytes in size (while logical erase blocks and logical pages discussed below may be approximately 40 MB and 8 kB, respectively).

Physical address space 304, in one embodiment, is divided into physical addresses corresponding to the arrangement of data on the physical recoding media. As will be discussed in further detail with respect to FIG. 3B, in one embodiment, the content of logical blocks 310 may be stored as packets 360 within logical erase blocks 320.

As shown, the contents of logical blocks 310 that are contiguous with within logical address space 302 may be stored as packets that are non-contiguous in physical address space 304. In various embodiments, write operations and read operations can be addressed to any portion of logical address space 302. However, physical address space 304 may be organized as a log structure, in which write operations may be performed at only one or more append points, such as discussed below in conjunction with FIG. 3C. Accordingly, when a set of logical blocks 310 is initially stored in storage 130, blocks 310 may be stored contiguously within one or more logical erase blocks 320 identified by an append point (e.g., append point 372 discussed below). As sectors 310 become modified and rewritten within storage 130 at the append point, sectors 310 may become interspersed among multiple logical erase blocks 310. This interspersion is illustrated in FIG. 3A with the contents of logical blocks 310A-D being stored in packets 360 located among logical erase blocks 320A-D. In various embodiments, a mapping may be maintained to identify where particular data of logical blocks 310 are stored with physical address space 304.

Figure 3B:
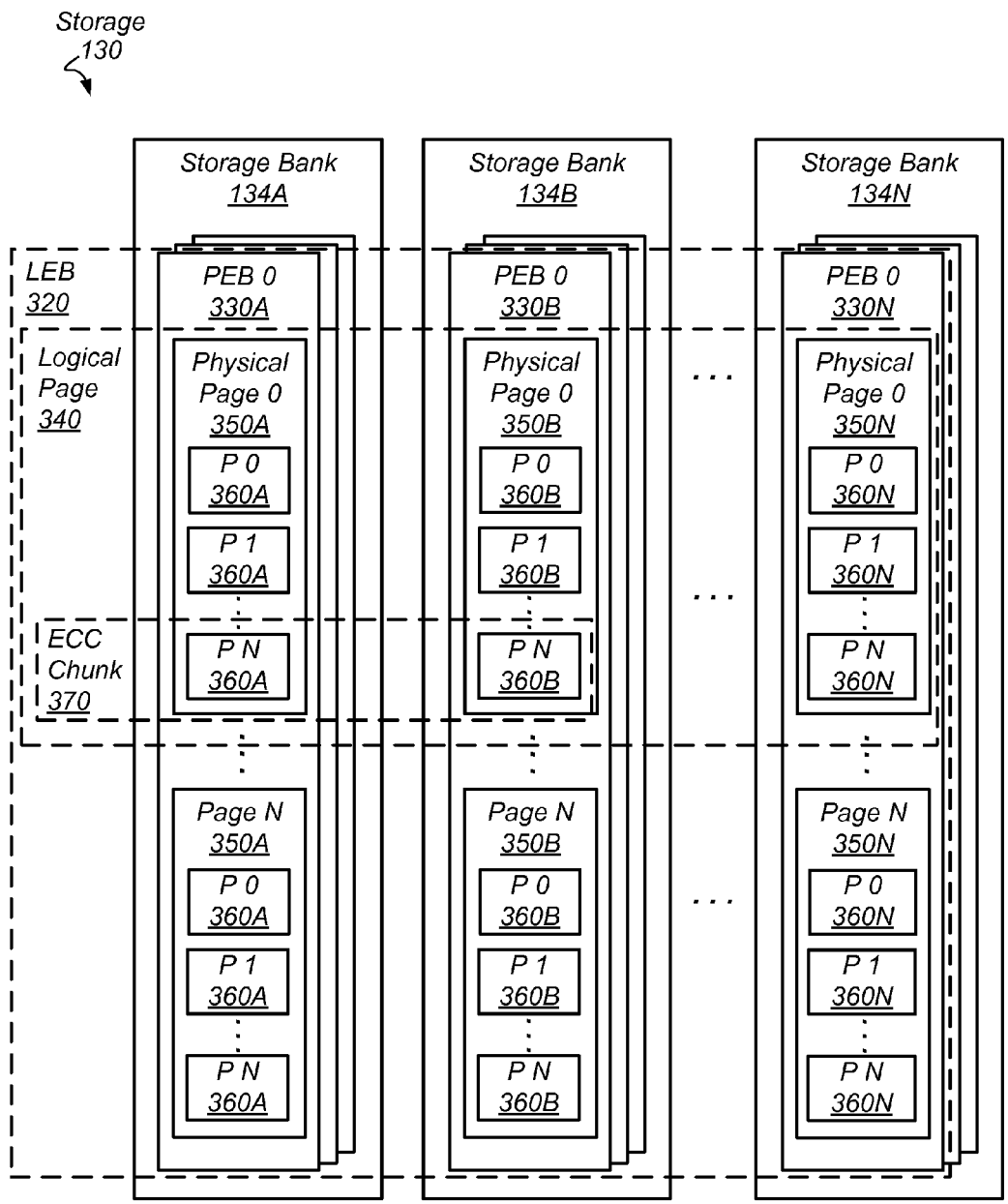

Turning now to FIG. 3B, a block diagram of storage blocks within storage 130 is depicted. In the illustrated embodiment, storage 130 is organized into logical erase blocks (LEBs) 320 that include multiple physical erase blocks (PEBs) 330, which are located in separate storage banks 134. A logical erase block 320 is further divided into multiple logical pages 340 that, in turn, include multiple physical pages 350. Pages 350 include multiple packets 360, which may be grouped into ECC chunks 370. (Groomer 127 and pregroomer 128 may operate on any suitable storage block including storage blocks at the logical level such as blocks 320, 340, and 370 and/or storage blocks at the physical level such as storage blocks 330, 350, and 360.)

As used herein, the term "erase block" refers broadly to a logical erase block or a physical erase block. In one embodiment, a physical erase block 330 represent the smallest storage block with a given bank 134 that can be erased at a given time (e.g., due to the wiring of cells on the die). In one embodiment, logical erase blocks 320 represent the smallest block erasable by controller 132 in response to receiving an erase command. In such an embodiment, when controller 132 receives an erase command specifying a particular logical erase block 320, controller 132 may erase each physical erase block 330 within the block 320 simultaneously. It is noted that physical erase blocks 339 within a given logical erase block 320 (e.g., blocks 330A and 330B) may be considered as contiguous in physical address space 304 even though they reside in separate banks 134. Thus, the term "contiguous" is applicable not only to data stored within the same physical medium, but also to data stored within separate media.

As used herein, the term "page" refers broadly to logical pages or physical pages. In one embodiment, a physical page 350 represents the smallest storage block within a given bank 134 that can be written to at a given time. In one embodiment, a logical page 340 is the smallest writable storage block supported by controller 132. (In one embodiment, controller 132 may include a buffer configured to store up to a logical page size of data; upon filling the buffer, controller 132 may write the contents of the buffer to a single logical page simultaneously.) In some instances, dividing a logical page 340 across multiple banks 134 may result in faster access times for a set of data when multiple banks 134 are accessible in parallel.

In one embodiment, a packet 360 represents the smallest storage block within a given bank 134 that can be read at a given time. In one embodiment, an ECC chunk 370 is the smallest storage block readable by controller 132. In some embodiments, packets 360 may be slightly larger than logical blocks 310 as they may include the contents of a logical block 310 (or multiple blocks 310 in some instances) as well as a packet header.

In some embodiments, driver 126 may associate metadata with one or more of storage blocks 320-370. As used herein, the term "metadata" refers to system data usable to facilitate operation of storage 130; metadata stands in contrast to, for example, data produced by applications 122 (i.e., "application data") or other forms of data would be considered by OS 124 as "user data." For example, in one embodiment, a logical erase block 320 may include metadata specifying, without limitation, usage statics (e.g., the number of program erase cycles performed on that block 320), health statistics (e.g., indicative how often corrupted data has been read from that block 320), security or access control parameters, sequence information (e.g., a sequence indicator), a persistent metadata flag (e.g., indicating inclusion in an atomic storage operation), a transaction identifier, or the like. In one embodiment, the header within a packet 360 may include packet metadata such as one or more LBAs associated with the contained data, the packet size, linkages to other packets, error correction checksums, etc. In various embodiments, driver 126 may use this information, along with other forms of metadata discussed below, to manage operation of storage 130. For example, driver 126 might use this information to facilitate performance of read and write operations, recover storage 130 to a previous state (including, for example, reconstruction of various data structures used by driver and/or replaying a sequence of storage operations performed on storage 130), etc. As will be discussed below, in some embodiments, pregroomer 128 may use this information in selecting particular storage blocks.

Figure 3C:
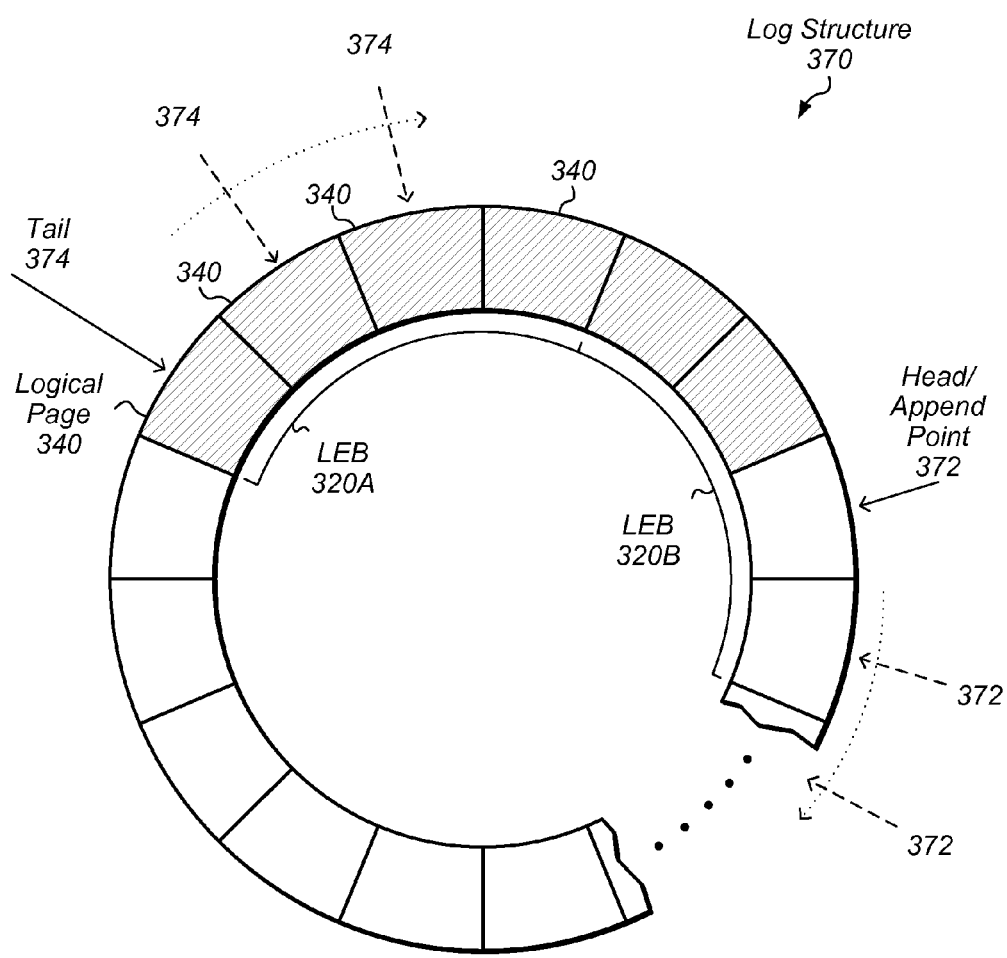

Turning now to FIG. 3C, a block diagram of log structure 370 within physical address space 304 is depicted. As shown, in various embodiments, data is stored sequentially at an append point 372 (also referred to as the "head") that starts an initial logical page 340. As additional data is stored, append point 372 advances to subsequent pages 340 in log structure 370. Eventually, after storing enough data, the append point 372 reaches the "last" page 340 in storage 130, at which point the append point 372 wraps back to the initial page 340. Thus, log structure 370 is depicted as a loop/cycle. As more data is stored, the number of available pages 340 (shown as unshaded pages 340) decreases and the number of used pages 340 (shown as shaded pages 340) increases. As discussed above, in order to reuse these pages 340 (i.e., make them available to receive further writes), in one embodiment, driver 126 (using groomer 127) performs erase operations on logical erase blocks 320. In one embodiment, a tail 374 marker is maintained to identify the oldest page 340 still in use within structure 370. When the logical erase block 320 with the oldest page 340 is eventually erased, tail 374 is advanced forward to the next oldest page 340 in use at the end of the log structure 370.

In general, data that is modified less frequently than other data in storage 130 will migrate towards tail 374 (such data may be described as having a "colder temperature" or simply as "cold data"). On the other hand, data that is modified more frequently (described as having a "hotter temperature" or as "hot" data) will typically be located closer to head 372. Thus, valid data located in LEB 320A is likely "colder" than data in LEB 320B.

It is noted that, in other embodiments, storage 130 may organized in a non-log format.

Figure 4:
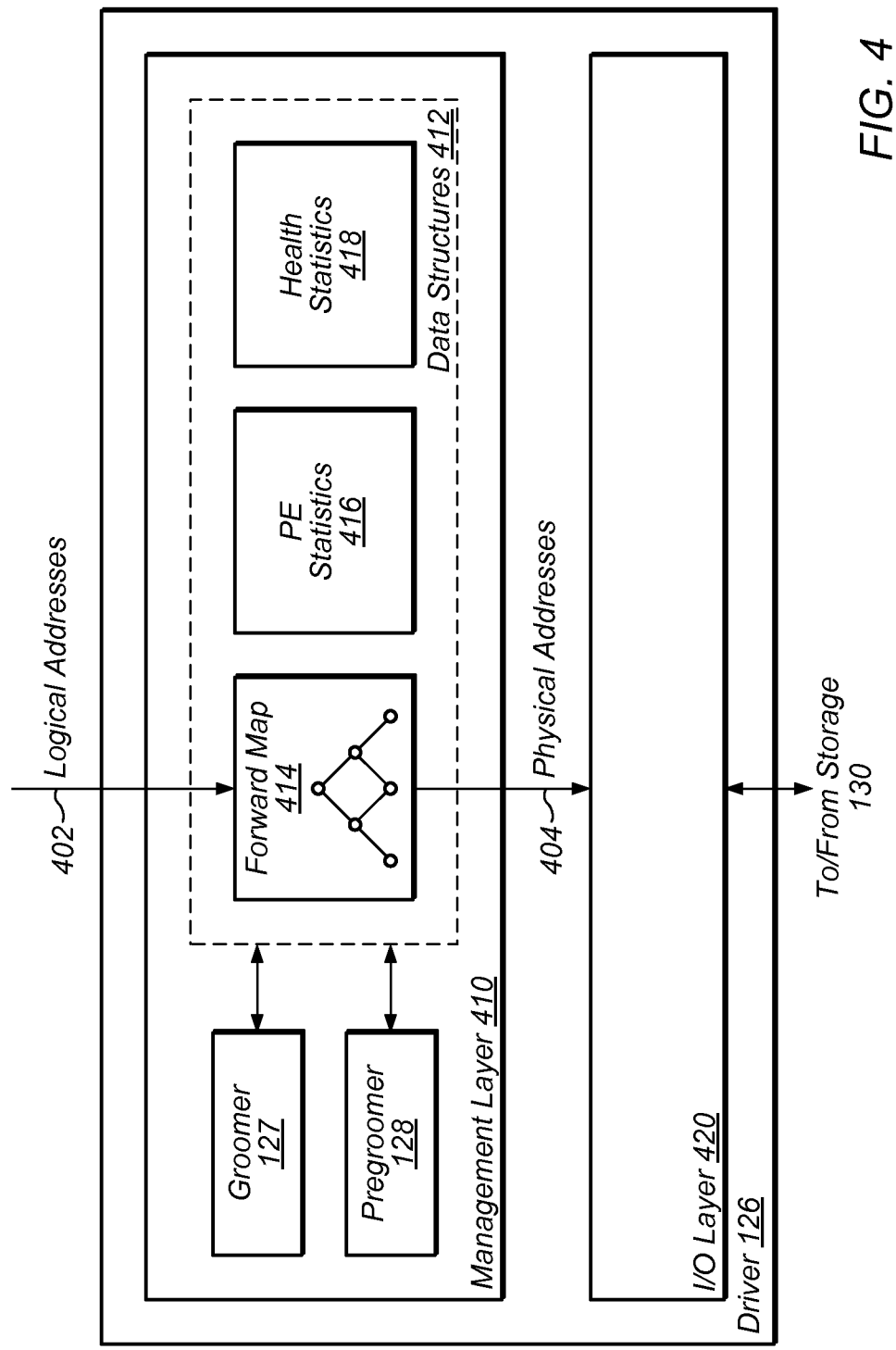
FIG. 4 is a block diagram illustrating one embodiment of a driver for a solid-state storage array.

Turning now to FIG. 4, a block diagram of driver 126 is depicted. As noted above, in one embodiment, driver 126 is executable to enable applications 122 and OS 124 to interact with storage 130. In the illustrated embodiment, driver 126 includes a management layer 410 and an input/output (I/O) layer 420.

Management layer 410, in one embodiment, handles higher-level block-related operations for driver 126. Accordingly, in various embodiments, management layer 410 tracks the mapping of logical addresses 402 to physical address 404, and performs translations for addresses 402 received from higher-level processes such as those of applications 122 and OS 124. In the illustrated embodiment, management layer 410 also performs garbage collection via groomer 127 and pregroomer 128. In some embodiments, management layer 410 maintains various forms of metadata in one or more data structures 412 located within RAM 120 such as forward map 414, program erase (PE) statistics 416, and heath statistics 418. (In other embodiments, data structure 412 may be maintained elsewhere in system 100 such as within storage 130.) In one embodiment, driver 126 periodically stores "snapshots" of these data structures 412 to storage 130 so that they can be reconstructed in the event of a crash. As used herein, the term "snapshot" refers to the storing of a copy of at least a portion of a data structure at a given point in time. As will be discussed below, groomer 127 and pregroomer 128 may use various ones of data structures 412.

Forward map 414, in one embodiment, is a forward mapping data structure usable to map a logical address space to a physical address. In some embodiments, forward map 414 may include metadata in addition to metadata used to facilitate mapping such as invalidity information. Although described as "forward" map, map 414 may also be used to perform a reverse mapping of a physical address to a logical address. As will be described in conjunction with FIGS. 5A and 5B, in one embodiment, forward map 414 is implemented as an extended-range b-tree data structure. In other embodiments, forward map 414 may be implemented using other data structures such as arrays, hash tables, other forms of trees, etc. In some embodiments, forward map 414 may also be implemented as multiple data structures such as a tree with pointers into an array.

PE statistics 416, in one embodiment, is a data structure that stores information indicative of how often logical erase blocks 320 (or physical erase blocks 330) have been erased and programmed. For example, data structure 416 stores for each logical erase block 320, a respective value for the number of program erase cycles (a cycle being one program operation and one erase operation) performed on that erase block 320. This information may be indicative of the life expectancy for a given erase block 320.

Heath statistics 418, in one embodiment, is a data structure that stores information indicative of whether logical erase blocks 320 (or physical erase blocks 330) are returning corrupted data when read. In various embodiments, ECC chunks 370 may be analyzed when they are read to determine whether they include corrupted bits (e.g., based on error correction checksums stored in packet headers as noted above). An indication of the number of detected corrupted bits for a given erase block 320 may be maintained in structure 418. If this number exceeds a threshold, that erase block 320 may be removed from service (i.e., disabled, not used for storing any user data). In some embodiments, indications of which erase blocks 320 have been disabled may be stored in health statistics 418 as well.

I/O layer 420, in one embodiment, handles lower-level interfacing operations with controller 132. Accordingly, layer 420 may receive a write request or a read request and the physical address 404 for that request; layer 420 may then issue the appropriate commands to controller 132 to cause storage 130 to fulfill that request. In some embodiments, I/O layer 420 may prepare data for DMA transactions and initialize a DMA controller to conduct the transactions.

Figure 5A:
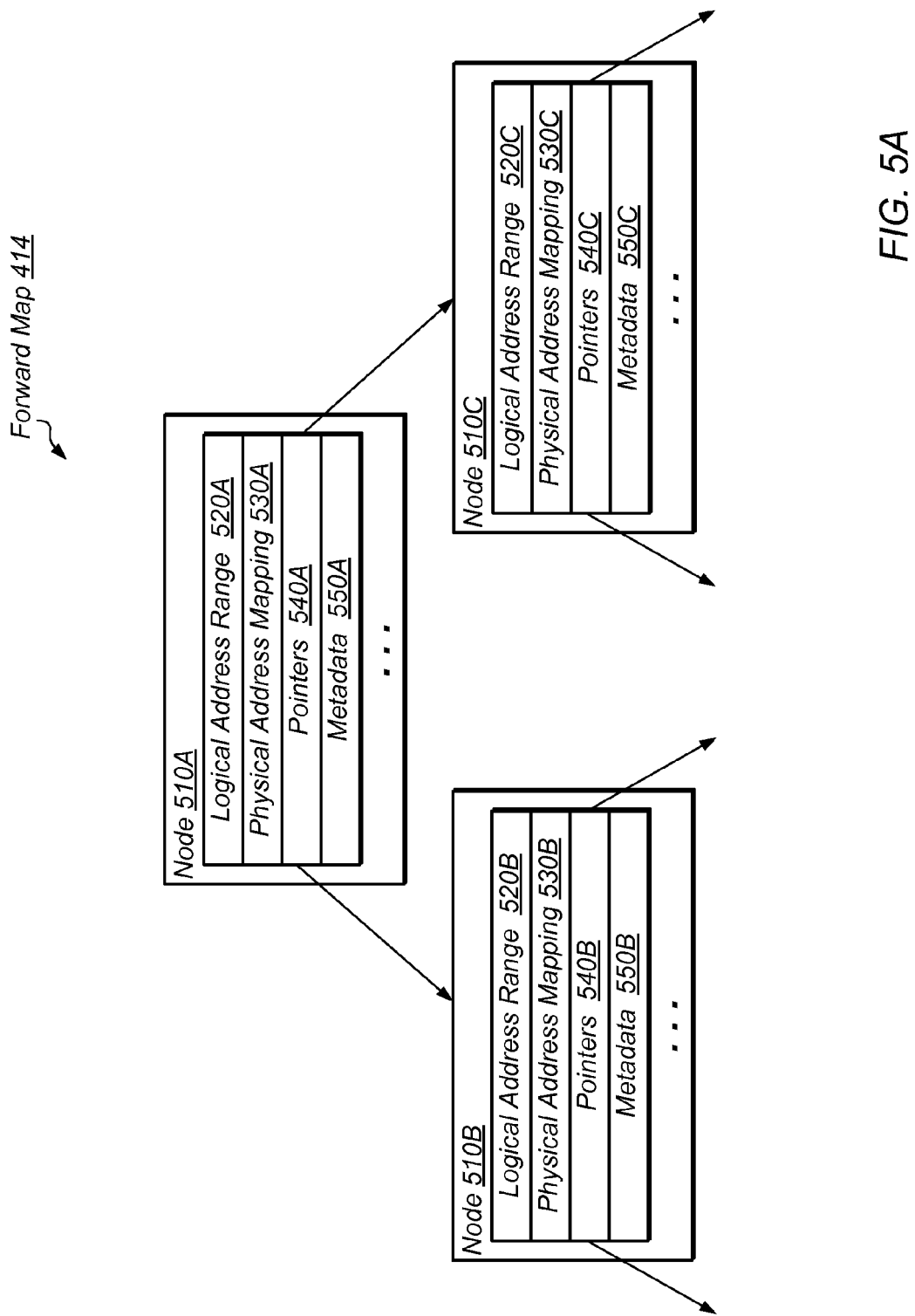
FIG. 5A is a block diagram illustrating one embodiment of a forward map data structure for translating a logical address to a corresponding physical address in a solid-state storage array.

Turning now to FIG. 5A, a block diagram of forward map 414 is depicted. As noted above, in the illustrated embodiment, forward map 414 is an extended-range b-tree that includes multiple nodes 510A-C. As shown, each node 510 includes a logical address range 520, a physical address mapping 530, one or more points 540, and additional metadata 550.

Logical address range 520, in one embodiment, is the range of logical addresses (e.g., LBAs) that are mapped using information within a given node 510. Accordingly, logical address range 520A specifies that physical address mapping 530A pertains to LBAs 50-100, for example. If a logical address does not "hit" in a node 510 (i.e., does not fall with in range 520 of a node such as range 520A in root node 510A), then map 414 is traversed to examine ranges 520 in one or more leaf nodes such as nodes 510B or 510C. In one embodiment, map 414 includes a node 510 for each range of logical addresses that have been mapped to a corresponding range of physical addresses, but does not include nodes 510 corresponding to unmapped ranges. Thus, in such an embodiment, if a given LBA is unused, unallocated, and/or unwritten, a corresponding node 510 does not exist for that LBA in map 414. On the other hand, if an LBA has been written to, map 414 includes a node 510 specifying range 520 that includes the LBA. As such, nodes 510 may be added and/or modified when data is written to storage 130. In such an embodiment, map 414 is also a sparse data structure, meaning that map 414 does not include mappings for an entire logical address space. Accordingly, in some embodiments, logical address space 302 may be significantly larger than physical address space 304.

Physical address mapping 530, in one embodiment, is the mapped physical addresses for a given range 520. In one embodiment, a given physical address is a composite a bank identifier for a storage bank 134, a PEB identifier for a PEB 330, a physical page identifier for a page 350, and a packet identifier for a packet 366; however in other embodiments, a physical address may be organized differently (e.g., a composite of LEB, logical-page, and ECC-chuck identifiers). In one embodiment, physical address mapping 550 is specified as a range of physical addresses. In another embodiment, physical address map 550 is a base address that is combined with an offset determined from the logical address. In other embodiments, mapping 550 may be specified differently.

Pointers 540, in one embodiment, identify leaf nodes 510 for a given node 510. In some embodiments, map 414 is organized such that a left pointer identifies a node 510 that has a lower address range 520 than the present node 510 and a right pointer may identify a node 510 having a higher address range 520. For example, if node 510A corresponds to the logical address range 50-100, node 510B may correspond to the range 0-50 and node 510C may correspond to the range 100-150. In some embodiments, map 414 may also be periodically balanced to give it a logarithmic access time.

Metadata 550, in one embodiment, is additional metadata that may not be used in mapping a logical address to physical address such as validity information and packet size. In one embodiment, validity information may identify whether particular locations (e.g., erase blocks, pages, or packets) store valid or invalid data. In some embodiments, metadata 550 may also include TRIM notes indicative of data that was invalidated in response to TRIM commands (in other embodiments, TRIM notes may be stored in a separate data structure within RAM 120, or on storage 130). As will be discussed in conjunction with FIG. 6, in one embodiment, validity information is used by groomer 127 to determine whether to erase a block 320. In some embodiments, storage 130 may support variable packet sizes; in such an embodiment, metadata 550 may specify the size packets used for a given logical address range 520. In some embodiments, metadata 550 may also include other information such as age information, usage information (e.g., whether particular logical addresses are associated with hot or cold data), etc.

Figure 5B:
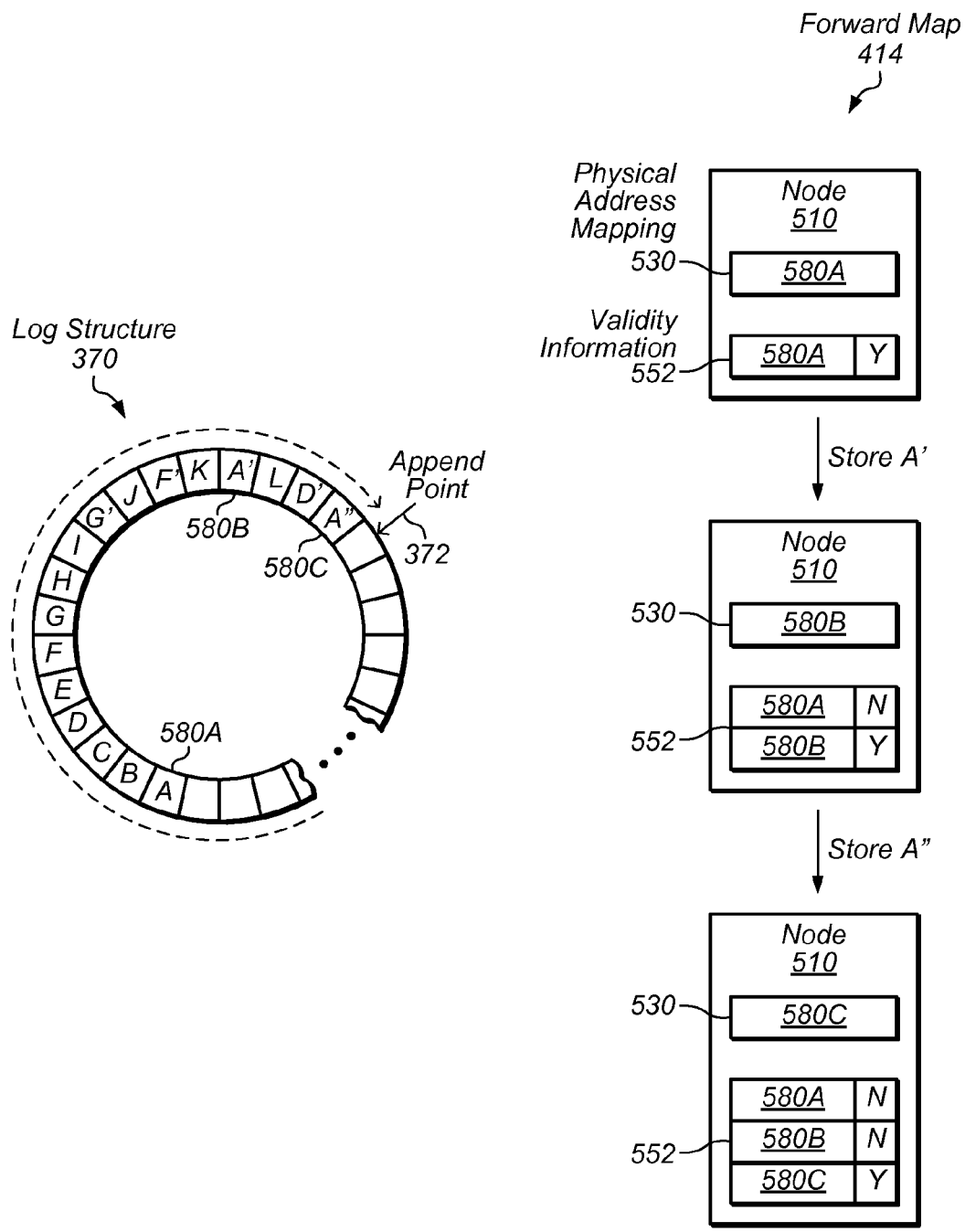
FIG. 5B depicts an exemplary usage of the forward map data structure.

Turning now to FIG. 5B, an exemplary usage of forward map 414 is depicted. In this example, the letters A-L represent various sets of data stored within log structure 370. When data A is initially written to storage 130, it is stored at physical storage location 580A. To reflect this storage, a node 510 is added (or, in some instances, updated) in map 414. As shown, this node 510 may identify the physical address of location 580A and indicate that the data stored within that location is valid. When data A is subsequently updated (or merely moved), another instance of data A shown as A' is stored at a location 580B identified by the then current append point 372. A node 510 may then be updated (or, in some embodiments, another node 510 may be added) to reflect that the logical address for data A now maps to a physical address for location 580B; location 580A is then indicated as having invalid data. When data A is again written, another instance of data A shown as A" is stored at a location 580C. Again, a node 510 may be updated (or added) that identifies the physical address of location 580C as mapping to the logical address for data A; location 580B is also indicated as having invalid data. The previous (now invalid) instances A and A' may continue to reside in storage 130 until the corresponding logical erase blocks 320 corresponding to locations 580A and 580B are erased (i.e., reclaimed).

Figure 6:
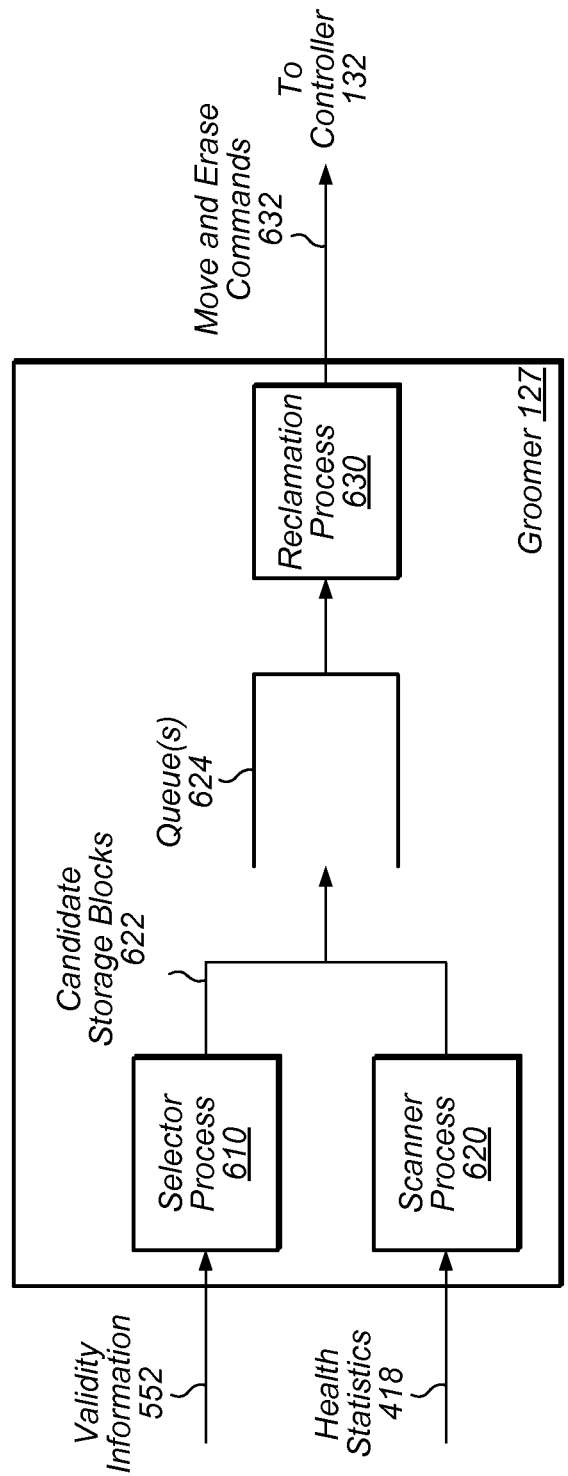
FIG. 6 is a block diagram illustrating one embodiment of a groomer process within a driver.

Turning now to FIG. 6, a block diagram of one embodiment of groomer 127 is depicted. As noted above, in various embodiments, groomer 127 is executable to identify and reclaim storage blocks for garbage collection. In the illustrated embodiment, groomer 127 includes a selector process 610, scanner process 620, and reclamation process 630. In some embodiments, these processes 610-630 are separately executable; however, in other embodiments, they may be implemented by a single process.

Selector process 610, in one embodiment, identifies storage blocks 622 that are candidates for reclamation based at least in part on the amount of invalid data stored within those blocks 340. In one embodiment, storage blocks 622 are logical erase blocks 320; in another embodiment, storage blocks 622 are physical erase blocks 330. In the illustrated embodiment, process 610 determines the amount of invalid data in storage blocks by accessing validity information 552 in forward map 414. In some embodiments, process 610 selects storage blocks that have the highest amounts of invalid data in storage 130.

Scanner process 620, in one embodiment, also identifies storage blocks 622 that are candidates for reclamation based on the amount of erroneous) data detected when data is read from those blocks. In the illustrated embodiment, process 620 determines this information based on health statistics 416 discussed above. In some embodiments, process 620 may select storage blocks known to be problematic or that have sat idle for an extended period of time (e.g., have experienced a retention time that exceeds a threshold associated with data integrity degradation) in order to periodically refresh the data in those blocks (assuming the erase blocks are not problematic to the point of not being usable). In some embodiments, process 620 may select storage blocks in order to remove those blocks from service.

In the illustrated embodiment, indications of identified candidate storage blocks 622 are stored in one or more queues 624 until those blocks can be serviced by reclamation process 630. In some embodiments, queues 624 may include queues associated with different priorities (e.g., a high-priority queue and a low-priority queue).

Reclamation process 630, in one embodiment, reclaims storage blocks 622 identified by processes 610 and 620. In some embodiments, process 630 may also prepare blocks for reclamation by moving (i.e., copying and invalidating) remaining valid data from those blocks. In the illustrated embodiments, process 630 moves remaining valid data and erases blocks by issuing corresponding commands 632 to controller 132.

In one embodiment, processes 610-630 may be invoked when the number of available logical erase blocks 320 (or physical erase blocks 330) falls below a threshold value indicative of when garbage collection should be performed. In some embodiments, processes 610-630 may be invoked when storage 130 has available bandwidth to handle additional program and erase operations for garbage collection (e.g., storage 130 is not fully occupied with performing read and write operations initiated by applications 122 and OS 124).

Figure 7:
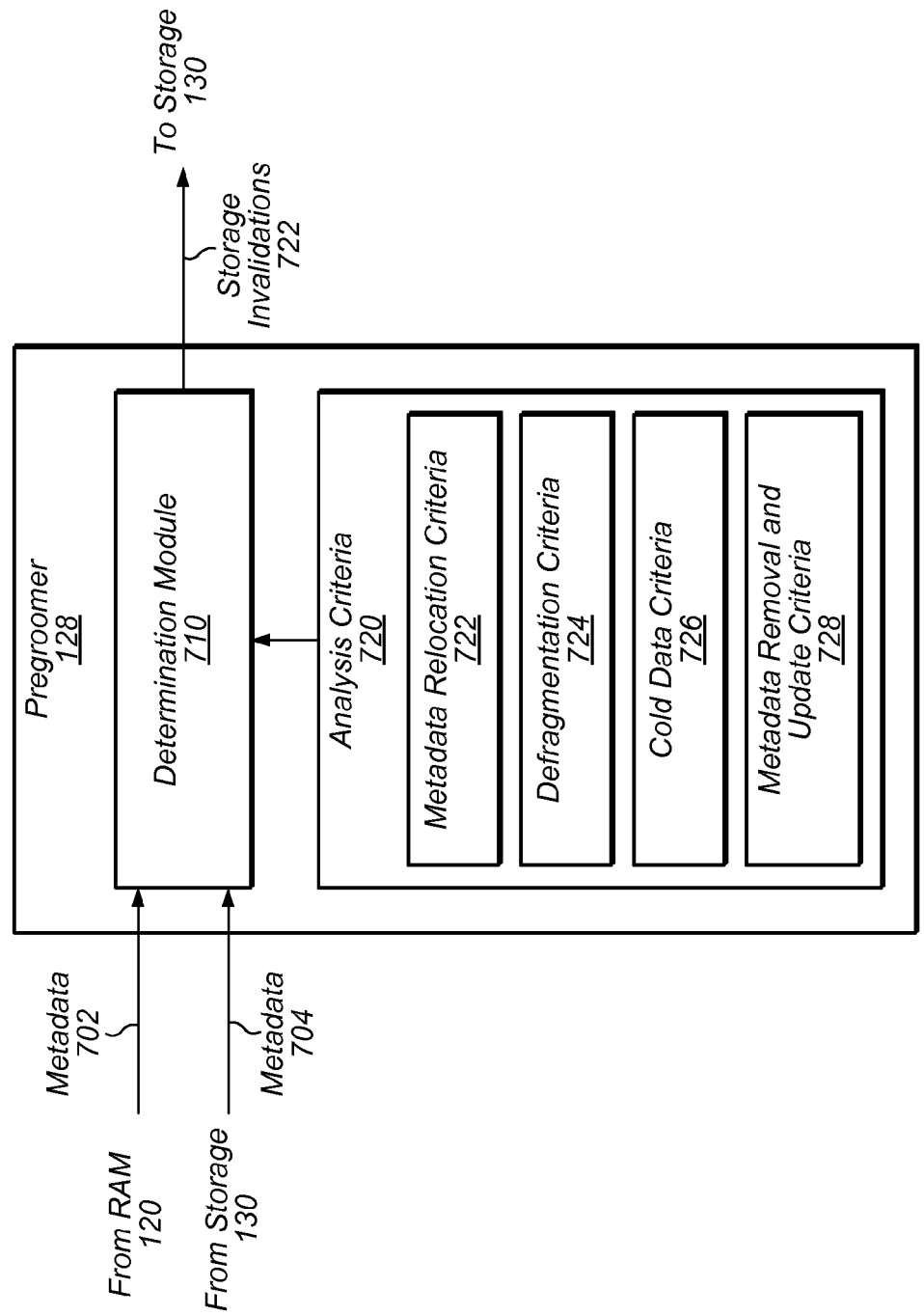
FIG. 7 is a block diagram illustrating one embodiment of a pregroomer process within a driver.

Turning now to FIG. 7, a block diagram of one embodiment of pregroomer 128 is depicted. As noted above, in various embodiments, pregroomer 128 is executable to operate on selected storage blocks to adjust attributes of the selected storage blocks such that the selected storage blocks satisfy selection criteria for selection by groomer 127. For example, in some embodiments, pregroomer 128 may operate on selected storage blocks by copying and/or invalidating data in selected storage blocks (e.g., selected logical erase blocks 320 and/or physical erase blocks 340). In the illustrated embodiment, pregroomer 128 includes a determination module 710 and a set of analysis criteria 720. As noted above, pregroomer 128 may be implemented using a single or multiple processes. It should be noted that operation of the pregroomer 128 to increase the likelihood a storage block will satisfy selection criteria for selection by groomer 127 may be influenced by policies and/or configuration settings for the driver 126 or controller 132 that may shift, or balance, the emphasis on satisfying groomer selection criteria and minimizing writing of data caused by management and operation of the controller or driver rather than writing of data due to application write requests.

In certain embodiments, determination module 710 analyzes metadata 702 from RAM 120 and metadata 704 from storage 130 based on analysis criteria 720 to select storage blocks and perform storage invalidations 722 for data within those selected blocks. In one embodiment, metadata 702 may include metadata from data structures 412 (as discussed above in conjunction with FIG. 4). In one embodiment, metadata 704 may include logical erase block metadata and packet metadata (such as discussed above in conjunction with FIG. 3B). In one embodiment, analysis criteria 720 include various rules that dictate when storage blocks are to be selected (e.g., based on the particular data within those blocks) and how they are to be operated on (e.g., invalidating data, copying data, consolidating data from a storage block with similar data from other storage blocks, etc.). In various embodiments, analysis criteria 720 may be specified in a manner that seeks to balance performing write operations to invalidate data and minimizing write amplification (i.e., writes to cells caused by management of storage 130 as opposed to user directed writes), which can increase wear leveling on cells.

Metadata relocation criteria 722, in one embodiment, are criteria that are usable to increase the amount of invalid data within selected storage blocks by relocating metadata in storage 130. Accordingly, in one embodiment, criteria 722 include criteria specifying that storage blocks be selected if they include metadata and that the metadata can be consolidated into a single storage block. This metadata may include any of the metadata described above such as logical erase block records, TRIM notes, atomic notes (i.e., a note written to storage 130 to determine whether a block of data has been successfully written to storage 130—this note may be written as part of a write transaction to indicate successful completion of the write), etc. In some embodiments, criteria 722 specify that similar types of metadata be grouped or consolidated together such as grouping all TRIM notes together within a logical erase block 320. Consolidating metadata into a smaller set of one or more storage blocks may allow metadata to be stored more efficiently. In one embodiment, criteria 722 also include criteria specifying that, once consolidated, the metadata should be moved together—in some instances, this may reduce the number of read and write operations performed (and thus write amplifications). In some embodiments, criteria 722 may also specify that the consolidated metadata be moved at regular intervals—for example, when the distance between the location of the metadata and append point 372 exceeds a threshold, etc. An example of metadata relocation is discussed below with respect to FIG. 9.

Defragmentation criteria 724, in one embodiment, are criteria that are usable to increase the amount of invalid data within selected storage blocks by defragmenting data in storage 130. A set of data may be described herein as "fragmented" may refer to data that is non-contiguous in logical address space 302 or data that is contiguous in logical address space 302 (i.e., within a contiguous portion of address space 302), but is stored non-contiguously in physical address space 304 (e.g., data within separate non-sequentially addressed logical pages 350, non-adjoining logical erase blocks 320, etc.). As used herein, "defragmentation" refers to moving fragmented data into a contiguous portion of an address space. Accordingly, in one embodiment, criteria 724 may specify that storage blocks be selected if they include sets of fragmented data and that the data be consolidated into a contiguous portion of physical address space 304. In some embodiments, determination module 710 may identify fragmented data by examining logical address ranges 520 in forward map 414. For example, determination module 710 may determine that storage blocks have fragmented data if physical address ranges associated with the blocks are identified in separate nodes 510 having adjoining logical address ranges 520. In some embodiments, criteria 724 may further specify that nodes 510 with adjoining ranges 520 be consolidated into a single node 510 once the data stored at those ranges 520 has been defragmented—thus saving space by storing a single node 510 rather than multiple nodes 510. An example of data defragmentation is discussed below with respect to FIG. 10.

Cold data criteria 726, in one embodiment, are criteria that are usable to increase the amount of invalid data within selected storage blocks by relocating data that is less frequently used (i.e., "colder data") relative to other data in storage 130. The temperature of data (i.e., how frequently data is modified) may be identified using multiple techniques. In some embodiment, driver 126 (or controller 132) may maintain metadata identifying a respective rate of change for sets of data—e.g., each sector 310 may store a number of writes and/or a number of reads to that section 310. Thus, a given set of data may be identified as cold if its rate falls below a threshold value for identifying cold data. In some embodiments, data may be identified based on where valid data is located within storage 130 (e.g., as determined by validity information 562) relative to the location of tail 374—e.g., valid data may be classified as cold if it is within a threshold distance of tail 374. In some embodiments, data may be identified as cold based on the sequence number assigned to the logical erase block 320 including the data (as used herein, a "sequence number" refers to a number that is assigned to a logical erase block when it is initialized; lower numbers may connote older blocks, while higher numbers may connote younger blocks). Accordingly, in one embodiment, criteria 726 may specify that storage blocks be selected if they include data classified as "cold" (according to one or more of these techniques), and that cold data be consolidated within one or more storage blocks. In some embodiments, criteria 726 may further specify that, once consolidated, cold data be moved together—thus reducing the number of read and write operations performed. An example of cold data relocation is discussed below with respect to FIG. 11.

Metadata removal and update criteria 728, in one embodiment, are criteria that are usable to increase the amount of invalid data within selected storage blocks by marking obsolete metadata as invalid or by writing an updated version of metadata to storage 130 and marking older versions as invalid. In various embodiments, storage 130 may store metadata that becomes obsolete after particular operations have been performed, a particular amount of time has passed, etc. In some embodiments, this metadata may include TRIM notes (which may become obsolete once the data associated with received TRIM commands have been removed from the media), atomic notes (which may become obsolete once the write operation completes), epoch bits (temporal indicators that associate certain events or operations with a given period of time; this indicator may become obsolete after their associated events or operations have been performed), etc. For this type of metadata, the metadata can merely be marked as invalid once those conditions have been met no copying forward of the metadata is required. Accordingly, in one embodiment, criteria 728 may specify how to identify this type of metadata and to mark this metadata as invalid. In various embodiments, storage 130 may store data that is periodically updated making the old versions of data obsolete. For example, in one embodiment, storage 130 may maintain snapshots of one or more data structures 412 to enable recovery of those structures. As these structures 412 are modified in RAM 120, updated snapshots may be written to storage 130 making the older snapshots obsolete. Accordingly, in one embodiment, criteria 728 may specify when updated metadata should be written to storage 130 from RAM 120 and that any obsolete copies be invalidated and not persisted. An example of metadata removal and updating is discussed below with respect to FIG. 12.

Figure 8A:
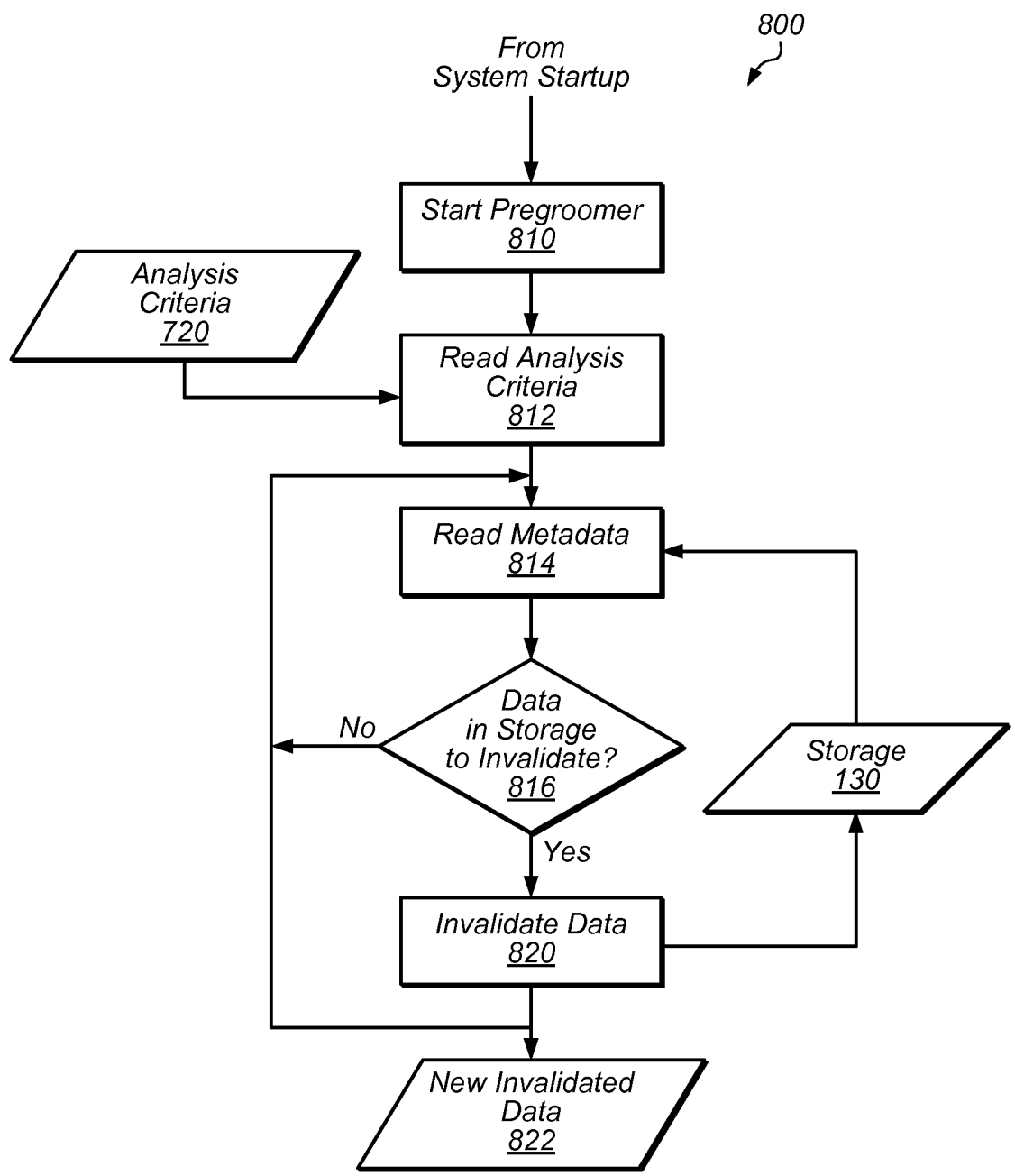
FIGS. 8A-8C are flow diagrams illustrating embodiments of methods that may be performed by a computer system with a solid-state storage array.

Turning now to FIG. 8A, a flow diagram of a method 800 is depicted. Method 800 is one embodiment of a method that may be performed by a computer system with a solid-state storage array such as computer system 100. As shown, in one embodiment, performance of method 800 may begin at system startup. At step 810, a pregroomer (e.g., pregroomer 128) may be "started" (i.e., invoked). The pregroomer reads one or more analysis criteria (e.g., criteria 720) at step 812. At step 814, the pregroomer reads metadata (e.g., from RAM 120 and/or storage 130 as discussed above) to determine, at step 816, whether data in the storage array can be invalidated. At step 820, data identified in step 816 is invalidated, which may include copying sets of data forward in the log structure and marking previous instances of the data as invalid. In one embodiment, this newly invalidated data 822 may be identified by a groomer and used to select erase blocks for reclamation. In some embodiments, steps 810-820 may be performed in a different order than shown and/or concurrently.

Figure 8B:
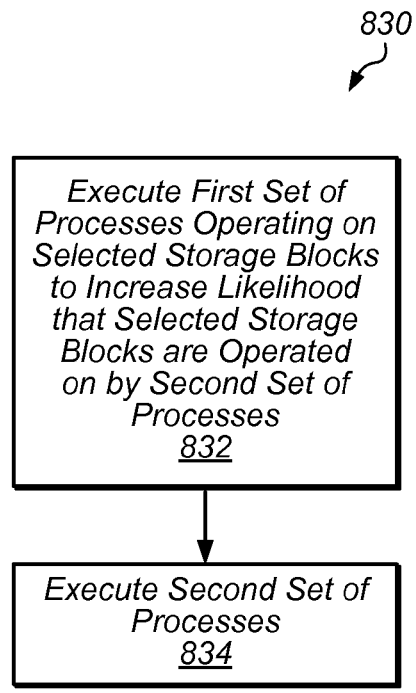

Turning now to FIG. 8B, a flow diagram of a method 830 is depicted. Method 830 is another embodiment of a method that may be performed by a computer system with a solid-state storage array. Method 830 begins in step 832 with a first set of processes (e.g., pregroomer 128) being executed that operates on selected ones of storage blocks (e.g., logical erase blocks 320) to increase a likelihood that the selected storage blocks are operated on (e.g., erased) by a second set of processes (e.g., groomer 127). In various embodiments, the first set of processes increases a likelihood that a storage block is erased by increasing the amount of invalid data within the storage block. As discussed above, in some embodiments, the amount of invalid data within a storage block is increased by moving metadata from the storage block, by moving fragmented data from the storage block to a contiguous portion of physical address space, by moving cold data from the storage block (e.g., as identified by a rate of change for the data in the storage block), or by removing or updating metadata on the storage array. In step 834, the second set of processes is executed to operate on storage blocks. In some embodiments, steps 832 and 834 may be performed in a different order and/or concurrently.

Figure 8C:
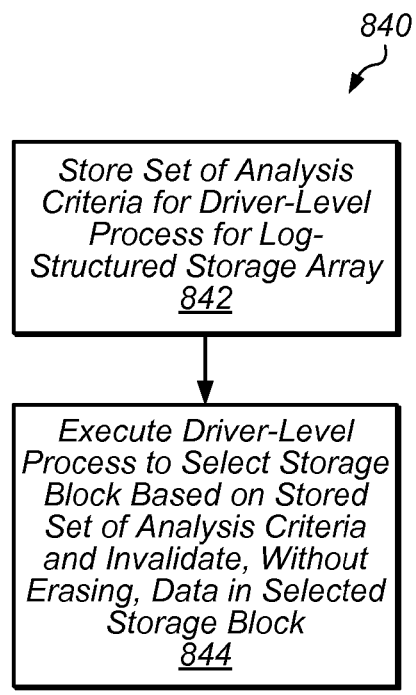

Turning now to FIG. 8C, a flow diagram of a method 840 is depicted. Method 840 is yet another embodiment of a method that may be performed by a computer system with a solid-state storage array. Method 840 begins in step 842, with the computer system storing a set of analysis criteria (e.g., criteria 720) for a first driver-level process (e.g., pregroomer 128) for a log-structured storage array that includes multiple storage blocks (e.g., logical erase blocks 320). Method 840 further includes, in step 844, executing the first driver-level process to select one of the storage blocks based on the stored set of analysis criteria and invalidate, without erasing, data in the selected storage block. In some embodiments, method 840 further includes executing a second driver-level process (e.g., groomer 127) to erase ones of the storage blocks. In one embodiment, step 844 includes the first driver-level process invalidating data in selected storage blocks, increasing the likelihood that the storage blocks are selected for erasure by the second driver-level process.

Figure 8D:
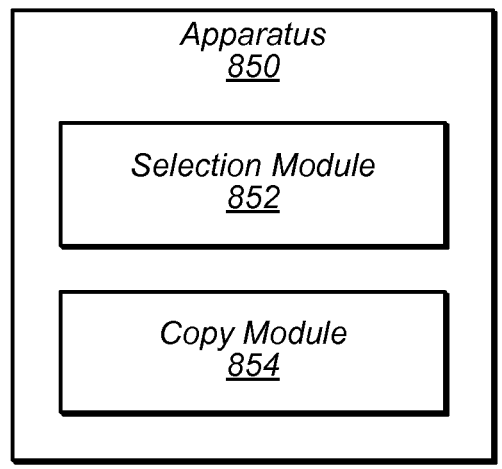
FIGS. 8D-E are block diagrams illustrating embodiments of an apparatus.

Turning now to FIG. 8D, a block diagram of an apparatus 850 including modules is depicted. As used herein, the term "module" refers to circuitry configured to perform operations or a memory having program instructions stored therein that are executable by one or more processors to perform operations. Accordingly, a module may be implemented as a hardware circuit implemented in a variety of ways. The hardware circuit may include, for example, custom very-large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, or the like. A module may also be any suitable form of non-transitory computer readable media storing program instructions executable to perform specified operations. Apparatus 850 may include modules to implement any of the functionality described herein. For example, in the illustrated embodiment, apparatus 850 includes a selection module 852 configured to select a first of the plurality of erase blocks and a copy module 854 configured to copy a subset of valid data within the first erase block to a second of the plurality of erase blocks. Modules 852 and 854 may be located within any suitable circuitry. For example, in some embodiments, the selection module 852 and the copy module 854 are within controller 132. In another embodiment, modules 852 and 854 may be located within a memory such as memory 120. In sum, the modules of apparatus 850 may be implemented in any suitable manner to perform functionality described herein. Apparatus 850 may also correspond to any suitable structure having the functionality of modules 852 and 854. In one embodiment, apparatus 850 is a computer system that includes (or is coupled to) a storage such as storage 130. In another embodiment, apparatus 850 is a card including a controller (such as controller 132) and one or more storage elements (such as storage banks 134). In yet another embodiment, apparatus 850 is a computer system including a memory system that stores modules 852 and 854.

Figure 8E:
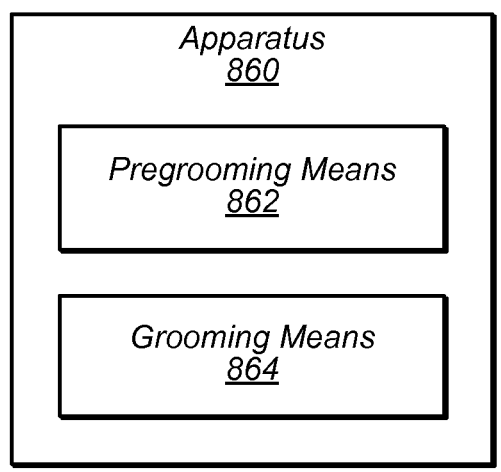

Turning now to FIG. 8E, a block diagram of an apparatus 860 including a pregrooming means 862 and a grooming means 864 is depicted. Apparatus 860 may correspond to any suitable structure having the functionality of pregrooming means 862 and grooming means 864. For example, apparatus 860 may be any suitable type of computing device such as a server, laptop, desktop, a mobile device, etc. In some embodiments, apparatus 860 may include multiple computing devices working together. In some embodiments, apparatus 860 is a card including a controller (such as controller 132) and one or more storage elements (such as storage banks 134.

In various embodiments, pregrooming means 862 may implement any of the functionality described herein with respect to pregroomer 128. Accordingly, in one embodiment, pregrooming means 862 is for selecting one or more of a plurality of storage blocks within a log-structured storage array based on a set of analysis criteria and for copying valid data from the one or more storage blocks to the current location specified by the append point. In some embodiments, the pregrooming means 862 is configured to select, based on the set of analysis criteria, two or more of the plurality of storage blocks that include a set of data, and to copy the set of data into a single storage block at the current location specified by the append point. In some embodiments, the pregrooming means 862 is configured to select the one or more storage blocks based on how frequently data in the one or more storage blocks is accessed. In some embodiments, the pregrooming means 862 is configured to select the one or more storage blocks based on their respective proximities to a current tail location of the log-structured storage array. In some embodiments, pregrooming means 862 may also implement functionality other than that described in conjunction with pregroomer 128. For example, in some embodiments, pregrooming means 862 may implement functionality described with respect to groomer 127.

Pregrooming means 862 may correspond to any suitable structure. In one embodiment, pregrooming means 862 is a hardware circuit configured to perform operations (e.g., controller 132). The hardware circuit may include, for example, custom very-large-scale integration (VLSI) circuits or gate arrays, off-the-shelf semiconductors such as logic chips, transistors, or other discrete components. Means 862 may also be implemented in programmable hardware devices such as field programmable gate arrays, programmable array logic, programmable logic devices, or the like. In another embodiment, pregrooming means 862 includes a memory having program instructions stored therein (e.g., RAM 120) that are executable by one or more processors (e.g., processor unit 110) to implement an algorithm. In one embodiment, pregrooming means 862 implements the algorithm discussed with respect to FIG. 8F. In some embodiments, pregrooming means 862 corresponds to module selection module 852 and copy module 854. Accordingly, the phrases "means for selecting one or more of a plurality of storage blocks within a log-structured storage array based on a set of analysis criteria" and "means for copying valid data from the one or more storage blocks to the current location specified by the append point" refer to any of the structures listed above as well as their corresponding equivalents.

In various embodiments, grooming means 864 may implement any of the functionality described herein with respect to groomer 127. Accordingly, in one embodiment, grooming means 864 is for selecting the one or more storage blocks as candidates for erasure and erasing the one or more storage blocks. In some embodiments, grooming means 864 may implement functionality other than that described with respect to groomer 127. Grooming means 864 may correspond to any suitable structure such as those discussed above with respect to pregrooming means 852. In one embodiment, grooming means 864 implements the algorithm discussed with respect to FIG. 8G. Accordingly, the phrase "means for selecting the one or more storage blocks as candidates for erasure and for erasing the one or more storage blocks" refers to any of the structures listed above as well as their corresponding equivalents.

Figure 8F:
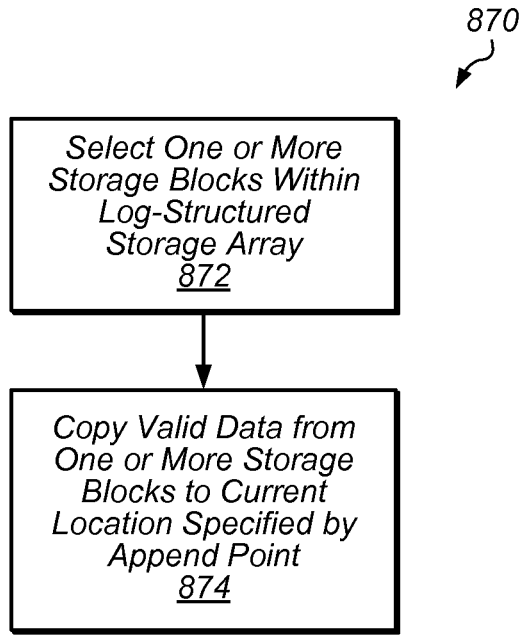
FIG. 8F is a flow diagram illustrating one embodiment of an algorithm implemented by a pregrooming means.

Turning now to FIG. 8F, a flow diagram illustrating an algorithm 870 is depicted. Algorithm 870 is one embodiment of an algorithm implemented by pregrooming means 862. In the illustrated embodiment, algorithm 870 includes selecting, at step 872, one or more of a plurality of storage blocks within a log-structured storage array based on a set of analysis criteria such as criteria 720. In one embodiment, the log-structured storage array has an append point specifying a current location within the array. In some embodiments, the selecting includes selecting, based on the set of analysis criteria, two or more of the plurality of storage blocks that include a set of data. In some embodiments, selecting the one or more storage blocks is based on how frequently data in the one or more storage blocks is accessed. Algorithm 870 further includes, at step 874, copying valid data from the one or more storage blocks to the current location specified by the append point. In some embodiments, the set of data is copied into a single storage block at the current location specified by the append point.

Figure 8G:
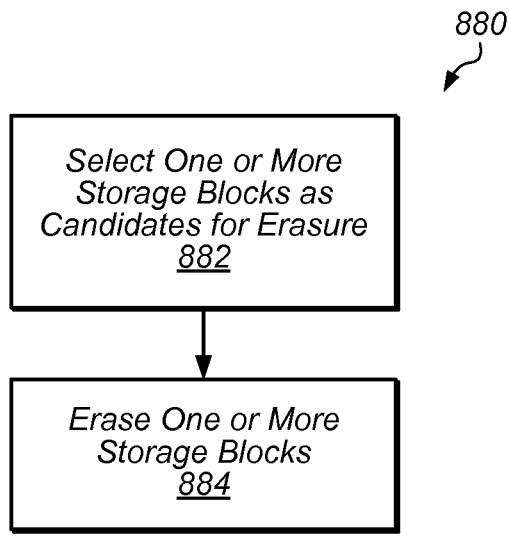
FIG. 8G is a flow diagram illustrating one embodiment of an algorithm implemented by a grooming means.

Turning now to FIG. 8G, a flow diagram of an algorithm 880 is depicted. Algorithm 880 is one embodiment of an algorithm implemented by grooming means 864. In the illustrated embodiment, algorithm 880 includes, at step 882, selecting the one or more storage blocks as candidates for erasure. In some embodiments, the selecting may be performed based on the amounts of invalid data found in those blocks. Algorithm 880 further includes, at step 884, erasing the one or more storage blocks.

Figure 9:
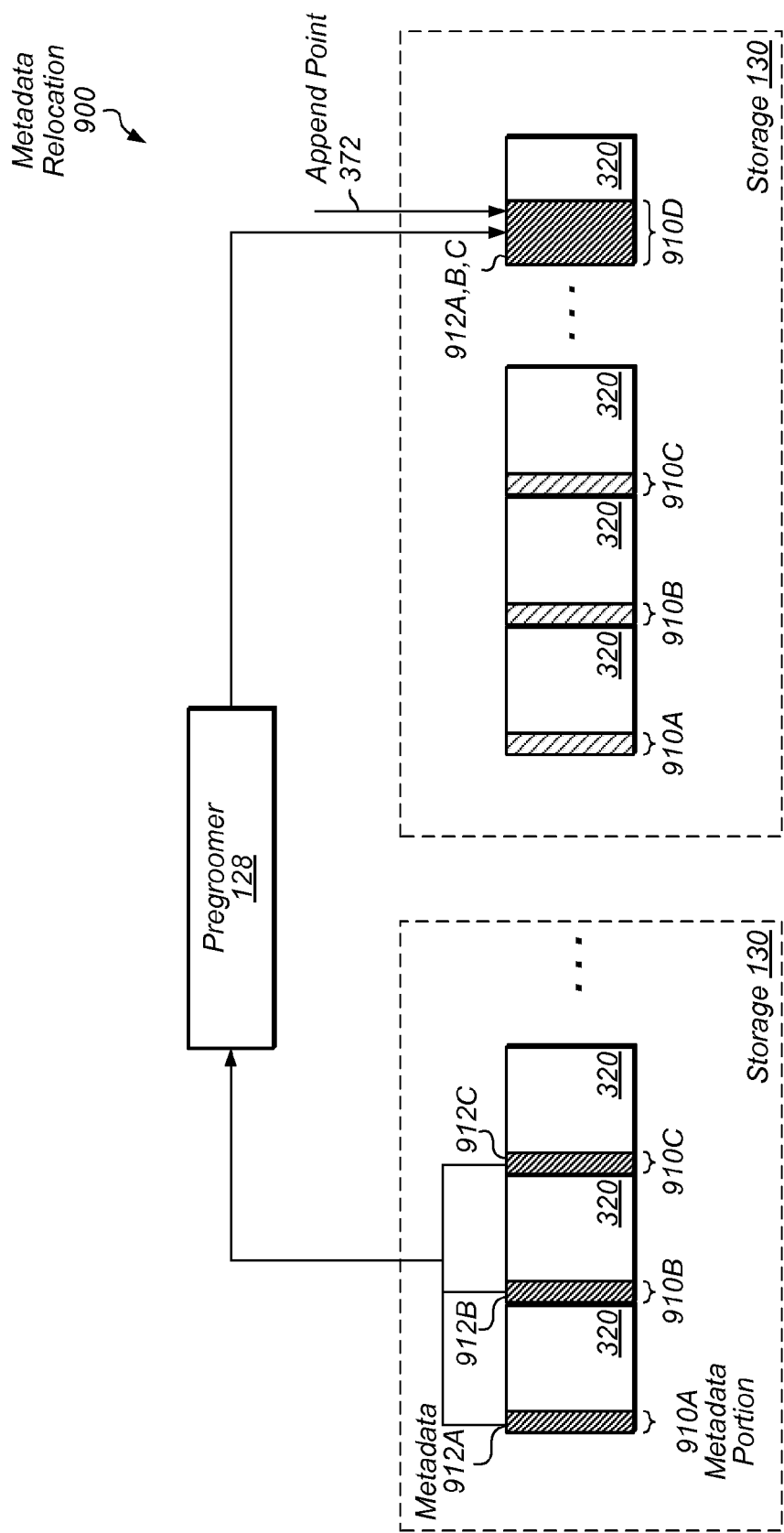
FIG. 9 depicts an example of metadata consolidation within a solid-state storage array.

Turning now to FIG. 9, an example of metadata relocation 900 is depicted. As shown, metadata 912A-C may reside in respective metadata portions 910A-C in multiple logical erase blocks 320 (including multiple physical erase blocks 330). (In some embodiments, portions 910 may be particular pages of erase blocks that are dedicated for storing metadata.) In the example, pregroomer 128 consolidates metadata 912A-C into another portion 910D at append point 372 (based for example on criteria 722). Pregroomer 128 may then indicate (e.g., via validity information 562) that the old instances of metadata 912A-C in portions 910A-C are invalid.

Figure 10A:
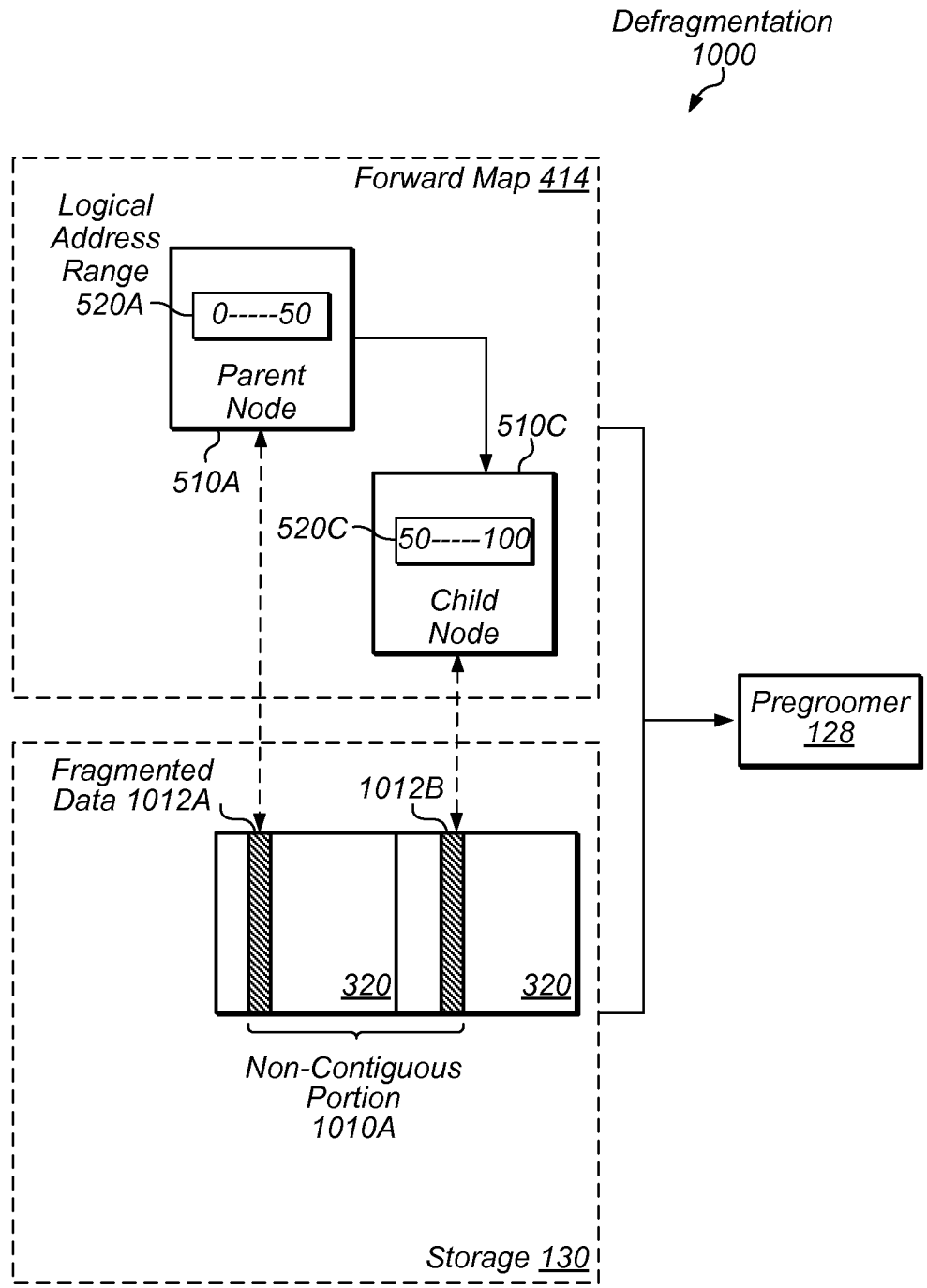
FIGS. 10A and 10B depict an example of defragmenting data within a solid-state storage array.
Figure 10B:
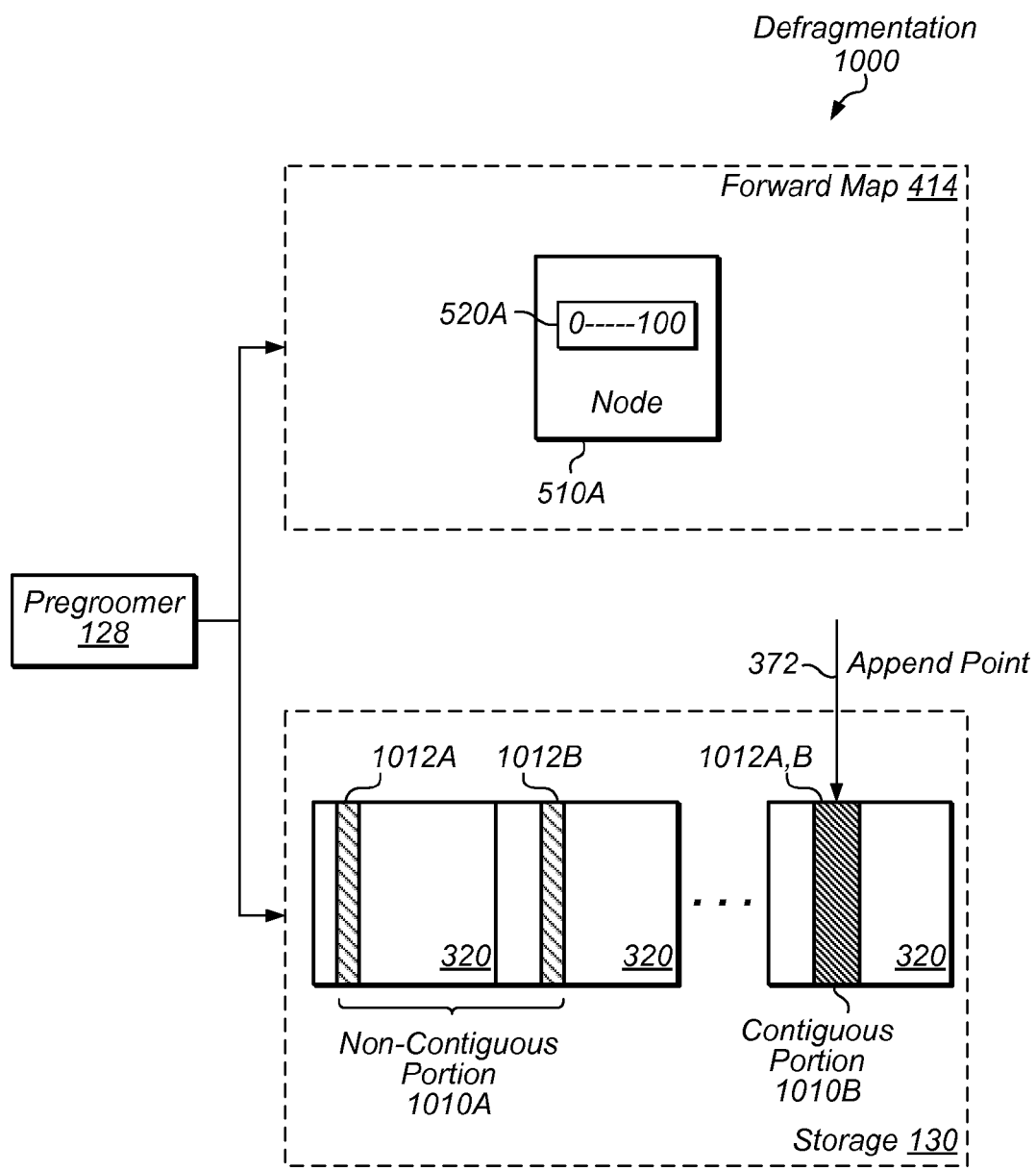

Turning now to FIGS. 10A and 10B, an example of defragmentation 1000 is depicted. As shown in FIG. 10A, a set of data 1012 corresponding to the contiguous range of logical address 0-100 is stored within a non-contiguous portion 1010A. In one embodiment, forward map 414 represents the mappings for these logical address ranges 520 using two nodes 510A and 510C because ranges 520A and 520B do not map to adjoining locations in physical address space. (As noted above, pregroomer 128 may identify that data 1012 is fragmented based on existence of these two nodes 510 in forward map 414). In FIG. 10B, pregroomer 128 has moved data 1012 into a contiguous portion 1010B and has indicated that previous instance of data 1012 is invalid. Pregroomer also merges nodes 510A and 510C into a single node 510A and adjusts the logical address to range from 0 to 100.

Figure 11:
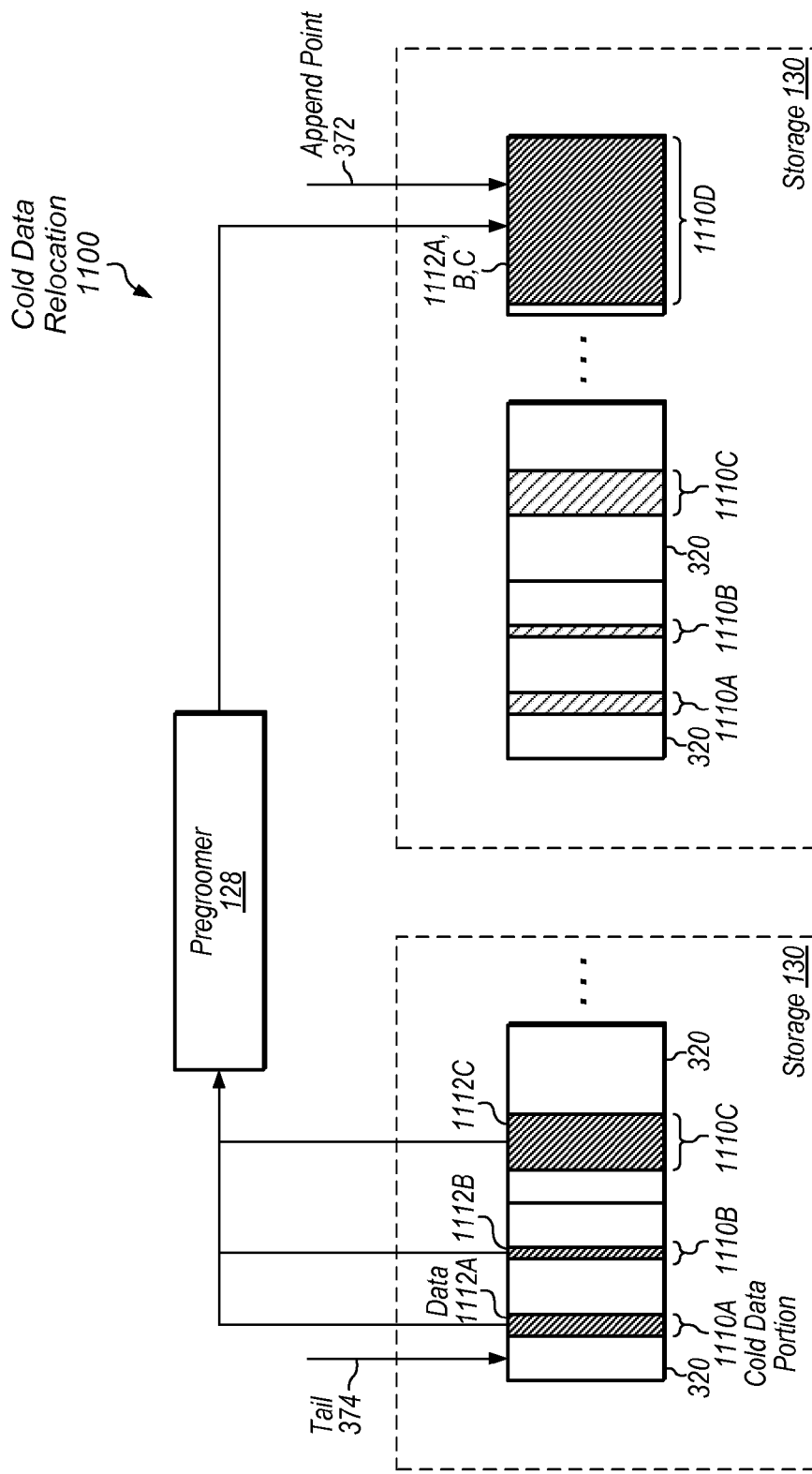
FIG. 11 depicts an example of relocating cold data within a solid-state storage array.

Turning now to FIG. 11, an example of cold data relocation 1100 is depicted. As shown, logical erase blocks 320 include data 1112A-C within portions 1110A-C, respectively. In one embodiment, pregroomer 128 identifies the valid data in these blocks 340 as being cold based one or more of the criteria 726 discussed above. Accordingly, pregroomer 128 copies data 1112A-C into a consolidated portion 1110D and marks the old instances of data 1112 in portions 1110A-C as invalid, thus making the blocks 320 ready for reclamation—presuming that all remaining valid data has been copied from the block 320).

Figure 12:
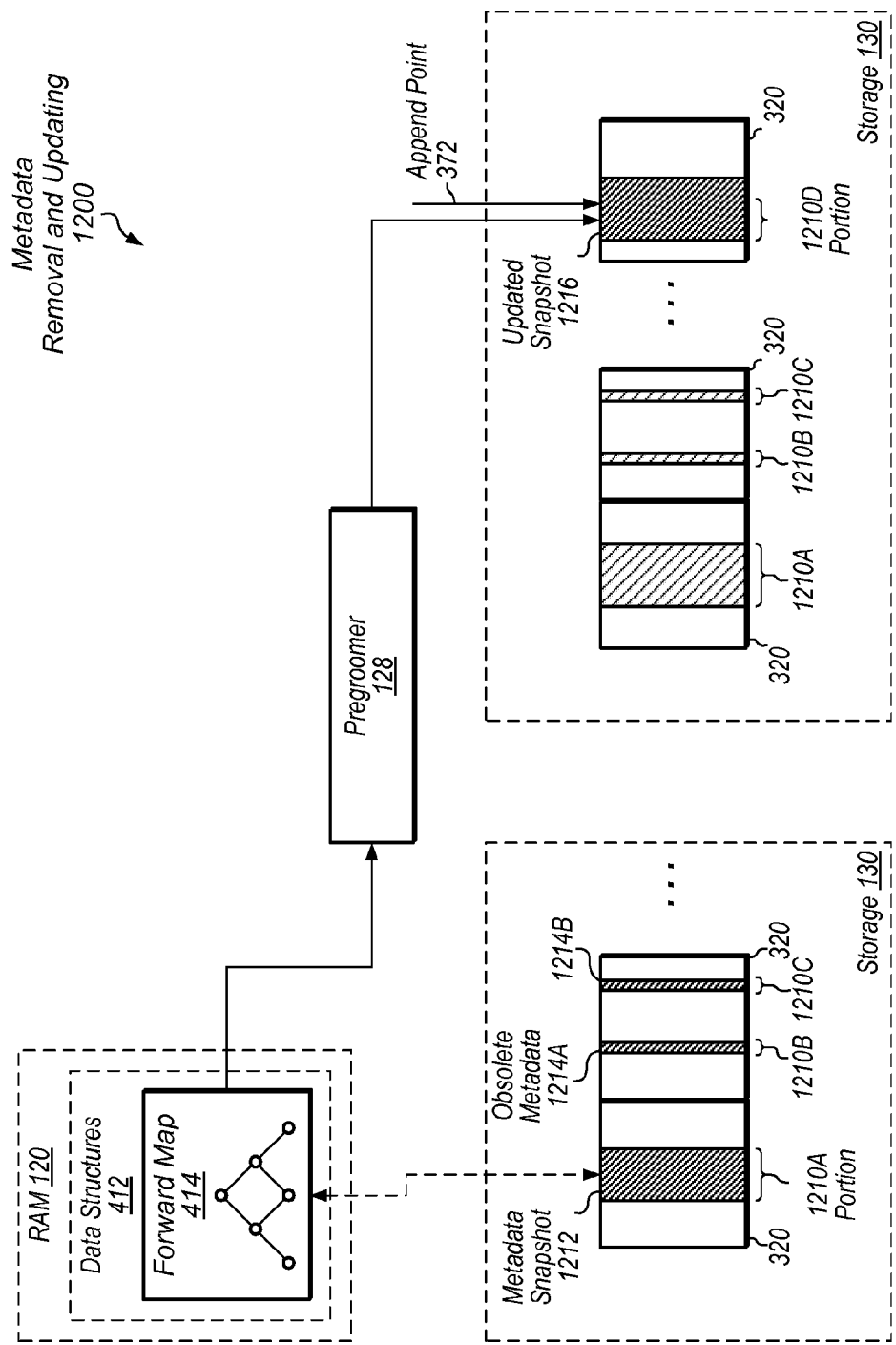
FIG. 12 depicts an example of metadata removal and updating within a solid-state storage array.

Turning now to FIG. 12, an example of metadata removal and updating 1200 is depicted. As shown, storage 130 may include snapshot metadata 1212 corresponding to one or more data structures 412 (such as forward map 414) residing in RAM 120. Storage 130 may also include metadata 1214 that has become obsolete for various reasons—e.g., atomic write notes, TRIM notes, etc. In this example, rather than read metadata 1212 and 1214 and copy that data forward to append point 372, pregroomer 128 writes an updated metadata 1216 (e.g., for forward map 414) from RAM 120 to a portion 1210D and marks metadata 1212 as invalid. Pregroomer 128 may also mark any obsolete metadata 1214 as invalid without copying any data to a new location.

In sum, pregroomer 128 may identify storage blocks in a storage array to invalidate using any suitable criteria. Such criteria should not be limited to the exemplary embodiments described above.

This disclosure has been made with reference to various exemplary embodiments. However, those skilled in the art will recognize that changes and modifications may be made to the exemplary embodiments without departing from the scope of the present disclosure. For example, various operational steps, as well as components for carrying out operational steps, may be implemented in alternate ways depending upon the particular application or in consideration of any number of cost functions associated with the operation of the system (e.g., one or more of the steps may be deleted, modified, or combined with other steps). Therefore, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, a required, or an essential feature or element. As used herein, the terms "comprises," "comprising," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Additionally, as will be appreciated by one of ordinary skill in the art, principles of the present disclosure may be reflected in a computer program product on a machine-readable storage medium having machine-readable program code means embodied in the storage medium. Any tangible, non-transitory machine-readable storage medium may be utilized, including magnetic storage devices (hard disks, floppy disks, and the like), optical storage devices (CD-ROMs, DVDs, Blu-Ray discs, and the like), flash memory, and/or the like. These computer program instructions may be loaded onto a general purpose computer, special purpose computer, or other programmable data processing apparatus to produce a machine, such that the instructions that execute on the computer or other programmable data processing apparatus create means for implementing the functions specified. These computer program instructions may also be stored in a machine-readable memory that can direct a computer or other programmable data processing apparatus to function in a particular manner, such that the instructions stored in the machine-readable memory produce an article of manufacture, including implementing means that implement the function specified. The computer program instructions may also be loaded onto a computer or other programmable data processing apparatus to cause a series of operational steps to be performed on the computer or other programmable apparatus to produce a computer-implemented process, such that the instructions that execute on the computer or other programmable apparatus provide steps for implementing the functions specified.

While the principles of this disclosure have been shown in various embodiments, many modifications of structure, arrangements, proportions, elements, materials, and components that are particularly adapted for a specific environment and operating requirements may be used without departing from the principles and scope of this disclosure. These and other changes or modifications are intended to be included within the scope of the present disclosure.

What is claimed is:

1. A non-transitory computer readable medium having program instructions stored thereon, wherein the program instructions are executable by a computer system to cause the computer system to:
   select a first of a plurality of erase blocks in a storage array accessible to the computer system;
   copy a subset of valid data from the first erase block to a second of the plurality of erase blocks; and
   invalidate the subset of valid data within the first erase block to increase a likelihood that storage capacity of the first erase block will be reclaimed by a groomer, the likelihood based on an amount of indicated invalid data in the first erase block.

2. The computer readable medium of claim 1, wherein the program instructions are further executable to cause the computer system to:
identify the first erase block as a candidate for performance of an erase operation.

3. The computer readable medium of claim 1, wherein the program instructions are further executable to cause the computer system to:
copy valid data from at least one other erase block to the second erase block along with the subset of valid data from the first erase block.

4. The computer readable medium of claim 1, wherein the first erase block is a logical erase block that includes a plurality of physical erase blocks.

5. An apparatus, comprising:
one or more processors;
memory having program instruction stored therein that are executable by the one or more processors to implement:
a first process executable to select one of a plurality of storage blocks based on a set of analysis criteria, to copy data from the selected storage block to another storage block, and to invalidate, without erasing, the data in the selected storage block, to increase a likelihood that storage capacity of the selected storage block will be reclaimed by a groomer, the likelihood based on an amount of indicated invalid data in the selected storage block.

6. The apparatus of claim 5, wherein the program instructions are further executable to implement:
a second process executable to erase ones of the plurality of storage blocks; and
wherein the first process is executable to invalidate data in the selected storage block,
increasing the likelihood that the selected storage block is selected for erasure by the second process.

7. The apparatus of claim 5, wherein the first process is executable to consolidate the data in the selected storage block with data from another storage block before invalidating the data in the selected storage block.

8. The apparatus of claim 5, wherein the apparatus is a computing device coupled to an array of storage that includes the plurality of storage blocks, and wherein the first process is a driver-level process.

9. The apparatus of claim 5, further comprising:
an array of storage array that includes the plurality of storage blocks, and wherein the one or more processors include a controller configured to perform program operations on ones of the plurality of storage blocks.

10. An apparatus configured to manage a plurality of erase blocks in a storage array, the apparatus comprising:
a selection module configured to select a first of the plurality of erase blocks; and
a copy module configured to copy a subset of valid data within the first erase block to a second of the plurality of erase blocks, and to invalidate the subset of valid data within the first erase block to increase a likelihood that storage capacity of the first erase block will be reclaimed by a groomer, the likelihood based on an amount of indicated invalid data in the first erase block.

11. The apparatus of claim 10, wherein the storage array is a flash-media-based storage array.

12. The apparatus of claim 10, wherein the selection module and the copy module are within a controller circuit configured to perform erase operations on the plurality of erase blocks.

13. A method, comprising:
executing a first set of processes on a system configured to access a plurality of storage blocks;
executing a second set of processes on the system; and
wherein the first set of processes operates on a selected one of the plurality of storage blocks based on a set of analysis criteria to copy valid data from the selected one of the plurality of storage blocks to another one of the plurality of storage blocks, and to invalidate, without erasing, the valid data in the selected one of the plurality of storage blocks, to increase a likelihood that storage capacity of the selected storage block will be reclaimed by a groomer, the likelihood based on an amount of indicated invalid data in the selected storage block.

14. The method of claim 13, wherein the second set of processes determines whether to operate on a storage block based on an amount of invalid data within the storage block.

15. The method of claim 14, wherein the second set of processes operates on the selected one of the plurality of storage blocks by erasing the selected one of the plurality of storage blocks.

16. The method of claim 13, wherein the first set of processes selects two or more of the plurality of storage blocks having a set of data that is stored in a non-contiguous portion of a physical address space; and
wherein the first set of processes increases the likelihood that the second set of processes operates on the two or more storage blocks to consolidate the set of data to a contiguous portion of the physical address space.

17. The method of claim 16, wherein the set of data corresponds to a contiguous portion of a logical address space, and wherein consolidating the set of data reduces a number of nodes in a forward mapping data structure usable to map an address from the logical address space to an address in the physical address space.

18. The method of claim 16, wherein the first set of processes selects the two or more storage blocks based on a rate of change of the set of data.

19. The method of claim 16, wherein the first set of processes selects the two or more storage block in response to the two or more storage blocks including metadata.

20. The method of claim 13, wherein the system maintains a current version of a set of metadata in volatile memory and maintains a non-current version of the set of metadata in one or more of the plurality of storage blocks; and
wherein the first set of processes increases a likelihood that the second set of processes operates on the one or more storage blocks by writing the current version of the set of metadata to another one of the plurality of storage blocks.

21. The method of claim 13, wherein the first and second sets of processes are processes of a driver usable by an operating system of the system to facilitate interaction between one or more applications on the system and a controller circuit of the system, wherein the controller circuit is configured to coordinate performance of erase and program operations for the plurality of storage blocks.

22. An apparatus, comprising:
means for selecting a first of a plurality of storage blocks within a log-structured storage array based on a set of analysis criteria applied to information about the selected storage block stored in a volatile memory and information about the selected storage block stored in one or more of the plurality of storage blocks;

means for copying a subset of valid data within the first storage block into a single storage block at a current location specified by an append point of the log-structured storage array; and means for invalidating the subset of valid data within the first storage block to increase a likelihood that storage capacity of the first storage block will be reclaimed by a groomer, the likelihood based on an amount of indicated invalid data in the first storage block.

23. The apparatus of claim 22, wherein the first storage block is selected based on how frequently data in the first storage block is accessed.

24. The apparatus of claim 22, wherein the first storage block is selected based on the first storage block's proximity to a current tail location of the log-structured storage array.

* * * * *